United States Patent [19]
Tomozawa et al.

[11] Patent Number: 5,717,157
[45] Date of Patent: Feb. 10, 1998

[54] FERROELECTRIC THIN FILM AND METHOD OF MANUFACTURING THE SAME

[75] Inventors: Atsushi Tomozawa, Osaka; Satoru Fujii, Takatsuki; Eiji Fujii, Yawata; Ryoichi Takayama, Suita; Masafumi Kobune, Akou; Satoshi Fujii, Himeji, all of Japan

[73] Assignee: Matsushita Electric Industrial Co., Ltd., Osaka, Japan

[21] Appl. No.: 351,216

[22] Filed: Nov. 30, 1994

[30] Foreign Application Priority Data

Dec. 1, 1993 [JP] Japan ................... 5-301411

[51] Int. Cl.$^6$ .............. H01L 35/22; C04B 35/472; C04B 35/491
[52] U.S. Cl. ............... 136/236.1; 136/238; 136/239; 501/134; 501/135; 501/136
[58] Field of Search ................ 136/236.1, 238, 136/239; 501/134, 135, 136

[56] References Cited

U.S. PATENT DOCUMENTS

| | | | |
|---|---|---|---|
| 3,773,564 | 11/1973 | Yamaka et al. | 136/213 |
| 4,946,810 | 8/1990 | Heistand, II et al. | 501/137 |
| 5,096,642 | 3/1992 | Shirasaki | 264/66 |
| 5,104,690 | 4/1992 | Greenwald | 427/126.3 |
| 5,244,742 | 9/1993 | Ogi et al. | 428/469 |
| 5,254,278 | 10/1993 | Kaneko | 252/62.9 |
| 5,415,945 | 5/1995 | Azumi et al. | 428/692 |
| 5,440,125 | 8/1995 | Henning et al. | 250/338.1 |

FOREIGN PATENT DOCUMENTS

| | | |
|---|---|---|
| 0 514 150 | 11/1992 | European Pat. Off. . |
| 41 21 474 | 1/1992 | Germany . |
| 59-141104 | 8/1984 | Japan . |
| 59-141427 | 8/1984 | Japan . |
| 61-285609 | 12/1986 | Japan . |
| 63-69272 | 3/1988 | Japan . |
| 1-253113 | 10/1989 | Japan ............. 501/136 |
| 2-255531 | 10/1990 | Japan ............. 501/134 |

OTHER PUBLICATIONS

Takayama, R. et al; "Preparation and characteristics of pyroelectric infrared sensors made of c-axis ... ", J. Appl. Phys. 61 (1), 1 Jan. 1987, pp. 411–415.
Patent Abstracts of Japan, vol. 16, No. 37 (Jan. 29, 1992).
Patent Abstracts of Japan, vol. 8, No. 266 Aug. 14, 1984, 59-141427.

*Primary Examiner*—Kathryn L. Gorgos
*Assistant Examiner*—Chrisman D. Carroll
*Attorney, Agent, or Firm*—Morrison & Foerster LLP

[57] ABSTRACT

A ferroelectric thin film includes lead titanate including La and at least an element which forms a six-coordinate bond with oxygen atoms and which is selected from the group consisting of Mg and Mn. The ferroelectric thin film is imparted with a high c-axis orientation while the film is formed without a polarization process. The ferroelectric thin film is manufactured by the steps of: positioning a MgO single crystal substrate disposed in advance with a foundation platinum electrode by a sputtering method on the surface of a substrate heater, exhausting a chamber, heating the substrate by a substrate heater, letting in sputtering gases Ar and $O_2$ through a nozzle into the chamber, and maintaining a high degree of vacuum. Then, high frequency electric power is input to a target from a high frequency electric power source to generate plasma, and a film is formed on the substrate. In this way, a ferroelectric thin film containing, for example, $[(1-x)\cdot Pb_{1-y}La_yTi_{1-y/4}O_3+x\cdot MgO]$, where $x=0.01\sim0.10$ and $y=0.05\sim0.25$ can be manufactured.

8 Claims, 5 Drawing Sheets

FERROELECTRIC THIN FILM AND METHOD OF MANUFACTURING THE SAME

FIELD OF THE INVENTION

This invention relates to a ferroelectric thin film which is used for a pyroelectric infrared detecting element or a piezoelectric element etc., and further relates to a method of manufacturing the ferroelectric thin film.

BACKGROUND OF THE INVENTION

A ferroelectric material is characterized by the presence of spontaneous polarization, even when the material is not in an electric field. This phenomenon arises from the presence of permanently-polarized dielectrics forming lines parallel or antiparallel within the material. In addition, the direction of polarization can be reversed by application of an external electric field. By taking advantage of this property, a ferroelectric material can be applied to various electronic components, such as a pyroelectric infrared detecting element, a piezoelectric element, a light modulator using electro-optical characteristics, or to a non-volatile memory element. A typical example of a well-known ferroelectric material is a perovskite crystal structure oxide, e.g., $PbTiO_3$, $Pb_{1-x}La_xTi_{1-x/4}O_3$ (PLT), $PbZr_xTi_{1-x}O_3$ (PZT), $BaTiO_3$. Among these oxides, a $PbTiO_3$ type ferroelectric material is thought to be a promising pyroelectric material because of its high Curie temperature, large pyroelectric coefficient, preferably small dielectric constant, and small dielectric loss. This material is already put to practical use in the form of an infrared sensor using ceramics.

Merits of this pyroelectric infrared sensor are that the operation can take place at room temperature, and the sensor has no wavelength dependency. Besides, the pyroelectric infrared sensor is superior among thermal type infrared sensors with respect to sensitivity and response speed.

At present, most ferroelectric materials used for an infrared detecting element or a piezoelectric element are polycrystalline ceramics. Along with the recent tendency of electronic components towards compact size, smaller electronic components compatible with ferroelectric materials are also demanded. Furthermore, since a pyroelectric element is formed thinner, heat capacity decreases and sensitivity increases accordingly. Therefore, due to the need for improved performance of an infrared detecting element, and also because of the development towards smaller and lighter components as mentioned above, the formation of a ferroelectric single crystal thin film which can achieve high sensitivity and high speed response has been drawing attention.

For example, a pyroelectric infrared sensor using a $PbTiO_3$ type thin film of c-axis orientation is reported in J. Appl. Phys., Vol. 61, P. 411 (1987). Also, a ferroelectric thin film is disclosed in Laid-open Japanese Patent Application No. (Tokkai Sho) 59-138004 which discloses improved performance index by adding a small amount of $La_2O_3$ to $PbTiO_3$. Furthermore, as disclosed in Laid-open Japanese Patent Application No. (Tokkai Sho) 59-141427, a small amount of $MnO_2$ is added to $PbTiO_3$ for improving figure of merit and dielectric loss of a ferroelectric thin film. In addition, Laid-open Japanese Patent Application No. (Tokkai Sho) 61-88403 discloses a mono phase ferroelectric $PbTiO_3$ thin film having a high electro-optical effect by selecting a Pb/Ti molar ratio in the $PbTiO_3$, and also having pyroelectricity and piezoelectricity. Also, it is disclosed in Laid-open Japanese Patent Application No. (Tokkai Hei) 3-245406 that a small amount of MgO is added to $PbTiO_3$ for obtaining a ferroelectric thin film having a high direct current resistivity and a high pyroelectric coefficient.

In the various conventional techniques mentioned above for forming thin films by using $PbTiO_3$ type materials, there has been some improvement made regarding pyroelectric characteristics or piezoelectric characteristics as well as with regard to resistivity, the ability to withstand voltage, and dielectric loss. However, a thin film which has satisfactory characteristics in all respects is not yet obtained.

SUMMARY OF THE INVENTION

It is an object of this invention to solve the above-mentioned conventional problems by providing a ferroelectric thin film which possesses a high c-axis orientation property, and also which does not require a polarization process such as with a bulk crystal. Another object of this invention is to provide a method of manufacturing the ferroelectric thin film.

In order to accomplish these and other objects and advantages, the ferroelectric thin film of the first embodiment of this invention comprises a ferroelectric thin film comprising lead titanate containing La, and at least an element which forms a six-coordinate bond with oxygen atoms and which is selected from the group consisting of Mg and Mn.

It is preferable that the element Mg is added to form a thin film having a composition of $[(1-x)\cdot Pb_{1-y}La_yTi_{1-y/4}O_3 + x\cdot MgO]$ ($x=0.01\sim0.10$, $y=0.05\sim0.25$). When Mg and La are added to the composition in an amount less than the above-noted range, the results are poorer. When Mg and La are added to the composition in an amount more than the above-noted range, it tends to have a negative influence on crystal properties and various characteristics such as pyroelectric characteristics.

Furthermore, it is preferable that the element Mn is added to form a thin film having a composition of $[(1-z)\cdot Pb_{1-y}La_yTi_{1-y/4}O_3 + z\cdot MnO_2]$ ($y=0.05\sim0.25$, $z=0.002\sim0.05$). When Mn and La are added to the composition in an amount less than the above-noted range, the effects are poorer. On the other hand, when Mn and La are added to the composition in an amount more than the above-noted range, it tends to have a negative influence on crystal properties and various characteristics such as pyroelectric characteristics.

It is also preferable that the crystal phase of the ferroelectric thin film is a perovskite single phase. As a result, the ferroelectric thin film has an especially high c-axis orientation property and is not conditioned to a polarization process.

In addition, it is preferable that the thickness of the ferroelectric thin film is in the range of 100 nm to 10 μm. When the thickness of the ferroelectric thin film is less than 100 nm it is generally too thin to establish effective insulation. When the thickness is more than 10 μm, it is less practical since the film formation takes too long.

It is preferable that the ferroelectric thin film is a thin film which is not conditioned to a polarization process (as-grown thin film). In a conventional method, it is usually necessary to conduct a polarization process (poling process) with a pyroelectric material under conditions of high temperature and high electric field. However, there is a possibility of the thin film being transformed or decomposed under the conditions of high temperature and high electric field. On the other hand, the thin film of this invention does not require a polarization process, so the thin film can be stably preserved. It is noted that as-grown thin film mentioned above is also called an as-deposited thin film.

Furthermore, it is preferable that an orientation rate α of the ferroelectric thin film is $0.85 \leq \alpha \leq 1.00$ in an X-ray diffraction analysis, provided that the height (intensity) at the (001) peak is I(001), the height (intensity) at the (100) peak is I(100), and $\alpha = I(001)/\{I(001)+I(100)\}$. The fact that the orientation rate α is $0.85 \leq \alpha \leq 1.00$ indicates a high c-axis orientation property of the crystal phase. Conventionally, when a common ceramic lead titanate is used, (101) is the strongest peak, and it can not be oriented to the (001) direction. Furthermore, since the c-axis direction is a polarization axis, the thin film has the property of being oriented to the c-axis. Thus, a polarization process (poling process) after forming the film is no longer necessary. The calculation method of the above-mentioned orientation rate α will be explained in Example 1 which will be described later. Depending on added amounts of La, Mg, and Mn, the orientation rate α varies. It is preferable that Mg is added, where $x=0.01~0.10$, and Mn is added, where $z=0.002~0.05$. The orientation rate α reaches the highest value by adding Mg, where $x=0.02~0.04$, and by adding Mn, where $z=0.005~0.02$. On the other hand, the orientation rate α goes down when Mg and Mn are beyond the limits of $x=0.01~0.10$ and $z=0.002~0.05$. The less La is added, the more the orientation rate α tends to rise.

It is also preferable that the ferroelectric thin film is held between two layers of electrode, because this structure is suitable for use as a pyroelectric infrared sensor element.

Furthermore, it is preferable that the ferroelectric thin film is used as a pyroelectric material for a pyroelectric infrared sensor, because this thin film is especially suitable for this particular use.

A second embodiment of this invention is a method of manufacturing a ferroelectric thin film comprising lead titanate containing La, and at least an element which forms a six-coordinate bond with oxygen atoms and which is selected from the group consisting of Mg and Mn. The method comprises the steps of: positioning an inorganic single crystal substrate disposed in advance with a foundation platinum electrode by a sputtering method on the surface of a substrate heater, exhausting a chamber, heating the substrate by a substrate heater, letting in sputtering gases into the chamber, maintaining a high degree of vacuum, inputting high frequency electric power to a target from a high frequency electric power source to generate plasma, and forming a film on the substrate. This method can efficiently form the ferroelectric thin film of this invention.

It is preferable that the target of the sputtering method is at least one compound having a composition selected from the group consisting of $[(1-w)\cdot\{(1-x)\cdot Pb_{1-y}La_yTi_{1-y/4}O_3+x\cdot MgO\}+w\cdot PbO]$ and $[(1-w)\cdot\{(1-x)\cdot(1-y)\cdot PbO+(1-x)y/2\cdot La_2O_3+(1-x)(1-y/4)\cdot TiO_2+x\cdot MgO\}+w\cdot PbO]$ ($x=0.01~0.10$, $y=0.05~0.25$, $w=0.05~0.40$), and wherein the number of targets is one or more. This is for the purpose of forming a thin film having the composition of this invention.

Furthermore, it is preferable that the target of the sputtering method is at least one compound having a composition selected from the group consisting of $[(1-w)\cdot\{(1-z)\cdot Pb_{1-y}La_yTi_{1-y/4}O_3+z\cdot MnO_2\}+w\cdot PbO]$ and $[(1-w)\cdot\{(1-z)\cdot(1-y)\cdot PbO+(1-z)y/2\cdot La_2O_3+(1-z)(1-y/4)\cdot TiO_2+z\cdot MnO_2\}+w\cdot PbO]$ ($y=0.05~0.25$, $z=0.002~0.05$, $w=0.05~0.40$), and the number of targets is one or more. This is for the purpose of forming a thin film having the composition of this invention.

It is also preferable that the target of the sputtering method has a composition at least selected from the group consisting of (A), (B), and (C):

(A) a combination of two different targets, wherein at least one target is selected from the group consisting of $[(1-w)\cdot Pb_{1-y}La_yTi_{1-y/4}O_3+w\cdot PbO]$ and $[(1-w)\cdot\{(1-y)\cdot PbO+y/2\cdot La_2O_3+(1-y/4)\cdot TiO_2\}+w\cdot PbO]$ ($y=0.05~0.25$, $w=0.05~0.40$), and at least one target is selected from the group consisting of MgO and Mg.

(b) a combination of two different targets, wherein at least one target is selected from the group consisting of $[(1-w)\cdot\{(1-x)\cdot PbTiO_3+x\cdot MgO\}+w\cdot PbO]$ and $[(1-w)\cdot\{(1-x)(PbO+TiO_2)+x\cdot MgO\}+w\cdot PbO]$ ($x=0.01~0.10$, $w=0.05~0.40$), and one target is $La_2O_3$.

(C) a combination of two different targets, wherein at least one target is selected from the group consisting of $[(1-x)\cdot Pb_{1-y}La_yTi_{1-y/4}O_3+x\cdot MgO]$ and $[(1-x)(1-y)\cdot PbO+(1-x)y/2\cdot La_2O_3+(1-x)(1-y/4)\cdot TiO_2+x\cdot MgO]$ ($x=0.01~0.10$, $y=0.05~0.25$), and one target is PbO.

In addition, it is preferable that the target of the sputtering method has a composition at least selected from the group consisting of (D), (E), and (F):

(D) a combination of two different targets, wherein at least one target is selected from the group consisting of $[(1-w)\cdot Pb_{1-y}La_yTi_{1-y/4}O_3+w\cdot PbO]$ and $[(1-w)\cdot\{(1-y)\cdot PbO+y/2\cdot La_2O_3+(1-y/4)\cdot TiO_2\}+w\cdot PbO]$ ($y=0.05~0.25$, $w=0.05~0.40$), and at least one target is selected from the group consisting of $MnO_2$ and Mn.

(E) a combination of two different targets, wherein at least one target is selected from the group consisting of $[(1-w)\cdot\{(1-z)\cdot PbTiO_3+z\cdot MnO_2\}+w\cdot PbO]$ and $[(1-w)\cdot\{(1-z)(PbO+TiO_2)+z\cdot MnO_2\}+w\cdot PbO]$ ($z=0.002~0.05$, $w=0.05~0.40$), and one target is $La_2O_3$.

(F) a combination of two different targets, wherein at least one target is selected from the group consisting of $[(1-z)\cdot Pb_{1-y}La_yTi_{1-y/4}O_3+z\cdot MnO_2]$ and $[(1-z)(1-y)\cdot PbO+(1-z)y/2\cdot La_2O_3+(1-z)(1-y/4)\cdot TiO_2+z\cdot MnO_2]$ ($y=0.05~0.25$, $z=0.002~0.05$) and one target is PbO.

It is preferable that the target of the sputtering method has a composition at least selected from the group consisting of the following (G), (H), and (I):

(G) a combination of three different targets, wherein at least one target is selected from the group consisting of $[(1-w)\cdot PbTiO_3+w\cdot PbO]$ and $[(1-w)\cdot(PbO+TiO_2)+w\cdot PbO]$ ($w=0.05~0.40$) and one target is $La_2O_3$, and at least one target is selected from the group consisting of MgO and Mg.

(H) a combination of three different targets, wherein at least one target is selected from the group consisting of $[Pb_{1-y}La_yTi_{1-y/4}O_3]$ and $[(1-y)\cdot PbO+y/2\cdot La_2O_3(1-y/4)\cdot TiO_2]$ ($y=0.05~0.25$), and one target is PbO, and at least one target is selected from the group consisting of MgO and Mg.

(I) a combination of three different target, wherein at least one target is selected from the group consisting of $[(1-x)\cdot PbTiO_3+x\cdot MgO]$ and $[(1-x)\cdot(PbO+TiO_2)+x\cdot MgO]$ ($x=0.01~0.10$), and one target is $La_2O_3$, and one target is PbO.

Furthermore, it is preferable that the target of the sputtering method has a composition at least selected from the group consisting of the following (J), (K), and (L):

(J) a combination of three different targets, wherein at least one target is selected from the group consisting of $[(1-w)\cdot PbTiO_3+w\cdot PbO]$ and $[(1-w)\cdot(PbO+TiO_2)+w\cdot PbO]$ ($w=0.05~0.40$), and one target is $La_2O_3$, and one target is selected from the group consisting of $MnO_2$ and Mn.

(K) a combination of three different targets, wherein at least one target is selected from the group consisting of $[Pb_{1-y}La_yTi_{1-y/4}O_3]$ and $[(1-y)\cdot PbO+y/2\cdot La_2O_3+(1-y/4)\cdot TiO_2]$ (y=0.05~0.25), and one target is PbO, and one target is selected from the group consisting of $MnO_2$ and Mn.

(L) a combination of three different targets, wherein at least one target is selected from the group consisting of $[(1-z)\cdot PbTiO_3+z\cdot MnO_2]$ and $[(1-z)\cdot(PbO+TiO)_2+z\cdot MnO_2]$ (z=0.002~0.05), and one target is $La_2O_3$, and one target is PbO.

It is preferable that a plurality of targets used for the sputtering method have four different kinds of combination consisting of (1) one target selected from the group consisting of $PbTiO_3$ and $[PbO+TiO_2]$, (2) one target is $La_2O_3$, (3) one target is selected from the group consisting of MgO and Mg, and (4) one target is PbO. This is for the purpose of forming a thin film having the composition of this invention.

In addition, it is preferable that a plurality of targets used for the sputtering method have four different types of combinations consisting of (1) one target selected from the group consisting of $PbTiO_3$ and $[PbO+TiO_2]$, and (2) one target is $La_2O_3$, and (3) one target is selected from the group consisting of $MnO_2$ and Mn, and (4) one target is PbO. This is for the purpose of forming a thin film having the composition of this invention.

It is also preferable that the target of the sputtering method comprises an oxide formed by press-molding ceramics or powder, or a simple metal plate. These materials are also suitable for the sputtering method.

Furthermore, it is preferable that the conditions of the sputtering comprise a temperature of from 550° to 650° C., a pressure of from 0.1 to 2.0 Pa, and an atmosphere gas comprising a mixed gas of argon and oxygen. For example, flow of the mixed gas of argon and oxygen is $Ar:O_2=9:1$ $cm^3/min$. A sputtering time depends on thickness of a desired film and on sputtering rate. As an example, it takes 15 hours to form a film having a thickness of 3000 nm with a sputtering rate of 200 nm/h.

Accordingly, the ferroelectric thin film described in the above-mentioned invention is formed by using lead titanate containing La, and at least an element which forms a six-coordinate bond with oxygen atoms and which is selected from the group consisting of Mg and Mn. Thus, the thin film is imparted with a high c-axis orientation property while the film is formed. In addition, this thin film does not require a polarization process as with a bulk crystal. Moreover, since the obtained thin film comprises lead titanate containing La and an element which forms a six-coordinate bond with oxygen atoms and which is selected from the group consisting of Mg and Mn, Mg and Mn fill a porous part of the B site which was caused by an additive of La into the A site. As a result, comparing this thin film with a conventional lead titanate thin film, it has excellent electric characteristics as a pyroelectric material, such as dielectric constant er, pyroelectric coefficient γ, and dielectric loss tanδ. Moreover, when the thin film was formed in a sputtering method by using a plurality of different targets, the composition can be controlled by controlling the high frequency electric power input to each target.

A perovskite crystal structure of $PbTiO_3$ will be explained by referring to FIG. 5. FIG. 5 is a model view showing an oxygen atom octahedron in the perovskite crystal structure of $PbTiO_3$. In FIG. 5, a black ball in the center represents titanium (Ti), white balls with dots represent lead (Pb), and plain white balls represent oxygen (O). The position of titanium (Ti) indicates the B site. Therefore, the B site can be also expressed as the "central position of an oxygen atom octahedron in a perovskite crystal structure". Here, the A site indicates lead (Pb).

DETAILED DESCRIPTION OF THE INVENTION

This invention will be described by referring to the following illustrative examples and attached figures.

EXAMPLE 1

An embodiment will be explained by referring to FIG. 1.

Figure 1:
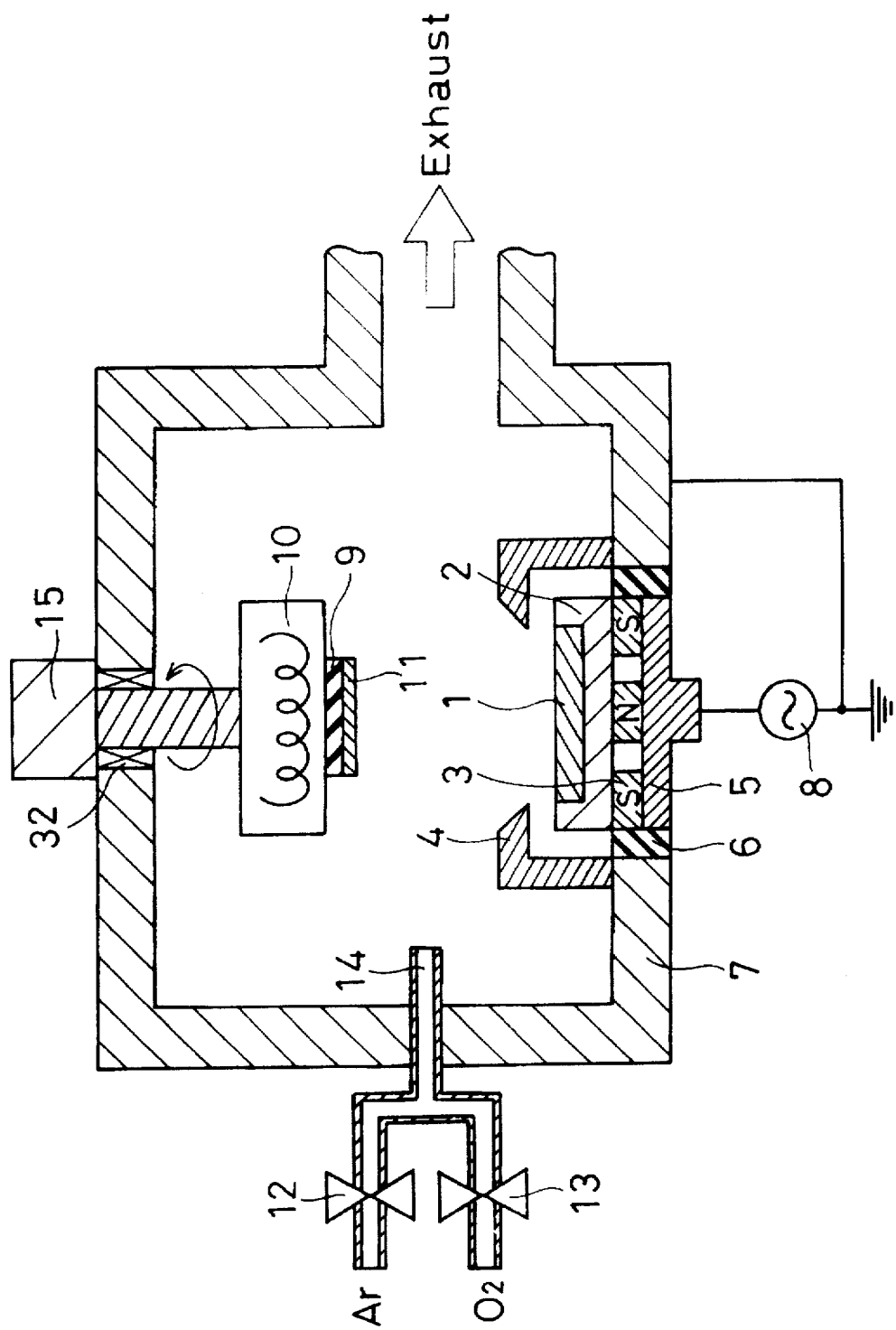
FIG. 1 is a schematic view showing a manufacturing apparatus of a ferroelectric thin film which is used for embodiments of this invention.

In FIG. 1, reference numeral 1 represents a target; 2, a target plate; 3, a magnet; 4, a cover for a brim of target plate 2; 5, a high frequency electrode; 6, an insulator; 7, a vacuum chamber; 8, a high frequency electric power source; 9, a substrate; 10, a substrate heater; 11, a metal mask; 12 and 13, valves; 14, a nozzle for providing sputter gas into vacuum chamber 7; 15, a motor for rotating substrate heater 10; and 32, a bearing with a seal.

The method of manufacturing the ferroelectric thin film is as follows. As shown in FIG. 1, the ferroelectric thin film of this invention is manufactured by a high frequency magnetron sputtering method. First, target 1 used for sputtering was manufactured in the following method.

PbO, $La_2O_3$, $TiO_2$, and MgO in powder form were mixed to attain a target composition comprising $\{(1-x)\cdot Pb_{1-y}La_yTi_{1-y/4}O_3+x\cdot MgO\}$ (x=0.01~0.10, y=0.05~0.25). Then, the mixed powder was calcined four hours at a temperature of 750° C. and smashed. Or, PbO, $La_2O_3$, $TiO_2$, and MgO in powder form were mixed to attain $\{(1-x)(1-y)\cdot PbO+(1-x)y/2\cdot La_2O_3+(1-x)(1-y/4)\cdot TiO_2+x\cdot MgO\}$ and smashed. To each of these powders, PbO powder with an excess of 5 to 40 mol % was mixed to prevent a Pb deficiency and to attain $[(1-w)\cdot\{(1-x)\ Pb_{1-y}La_yTi_{1-y/4}O_3+x\cdot MgO\}+w\cdot PbO]$ or $[(1-w)\cdot\{(1-x)\cdot(1-y)\cdot PbO+(1-x)y/2\cdot La_2O_3+(1-x)(1-y/4)\cdot TiO_2+x\cdot MgO\}+w\cdot PbO]$ (x=0.01~0.10, y=0.05~0.25, w=0.05~0.40). After 30 g of each powder was filled in target plate 2, a face pressure of about 250 $kgf/cm^2$ was provided with a hydraulic press to form target 1. The thin films obtained in these two different manufacturing methods showed equal characteristics.

Next, target plate 2 was placed on top of magnet 3, and cover 4 was placed thereon. Here, magnet 3 and high frequency electrode 5 disposed under the magnet are insulated from vacuum chamber 7 by insulator 6. Also, high frequency electrode 5 is connected to high frequency electric power source 8.

Substrate 9 of the thin film comprised a MgO single crystal substrate (20 mm×20 mm, thickness 0.5 mm) oriented to (100). On one side of substrate 9, a foundation electrode composed of platinum which had been priority oriented to (100) was formed by a sputtering method with a thickness of 100 nm, and was patterned. After substrate 9 was positioned on substrate heater 10, stainless metal mask 11 of 0.2 mm thick was disposed on the surface of substrate 9. Then, chamber 7 was exhausted, and substrate 9 was heated up to 600° C. by substrate heater 10. Substrate heater 10 was rotated by motor 15. After the heating step, valves 12 and 13 were opened to let in sputter gas of Ar and $O_2$ in a ratio of 9:1 through nozzle 14 into chamber 7 where a degree of vacuum was maintained at 0.5 Pa. Then, when high frequency electric power of 2.1 W/cm$^2$ (13.56 MHz) was input from high frequency electric power source 8 to generate plasma, a film was formed on substrate 9. In this way, a ferroelectric thin film composed of [(1-x)·$Pb_{1-y}La_yTi_{1-y/4}O_3$+x·MgO] (x=0.01~0.10, y=0.05~0.25) was produced. The thin film obtained had a thickness of about 1 μm after five hours of deposition time. On top of this ferroelectric thin film, a Ni—Cr electrode was formed by a DC sputtering method for the purpose of measurement and was patterned.

Figure 3:
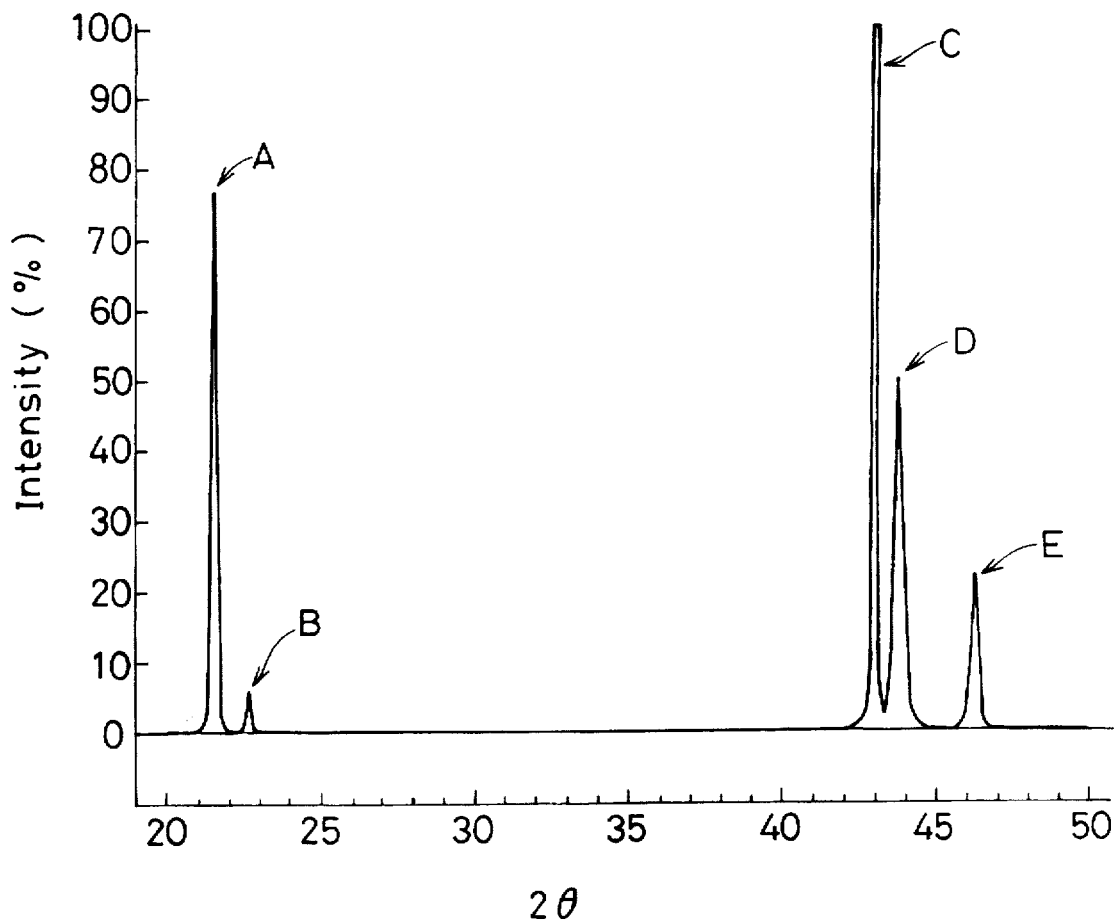
FIG. 3 is a graph showing an x-ray diffraction pattern of a ferroelectric thin film in Example 1 of this invention.

When this thin film was obtained, a solid capacity of each element was measured by an x-ray microanalyzer, and a crystal phase and a c-axis orientation rate α (=I(001)/{I(001)+I(100)}) were measured by an x-ray diffracting method. A graph of an x-ray diffraction is shown in FIG. 3. The measurement was conducted in the range of 20° to 50°. In FIG. 3, A indicates (001) peak of a thin film composed of [0.96($Pb_{0.9}La_{0.1}Ti_{0.975}O_3$) +0.04 MgO], B indicates (100) peak of the same thin film composed as above, C indicates a peak of a MgO monocrystal substrate, D indicates (002) peak of a thin film composed of [0.96($Pb_{0.9}La_{0.1}Ti_{0.975}O_3$) +0.04 MgO], and E indicates a combined peak of (200) of the same thin film composed as above and Pt of a foundation electrode.

Next, a calculation method of α will be explained. Referring to FIG. 3, intensity (height) I(001) of (001) peak shown as A and intensity (height) I(100) of (100) peak shown as B are measured from the chart, and α is calculated according to a calculation formula of α=I(001)/{I(001)+I(100)}. The thin film shown in FIG. 3 had α=0.936.

As described above, only (001), (100), and their high-order peaks were confirmed. When α was calculated according to this result, an as-grown thin film was in the range of 0.85≦α≦1.00 and showed a high c-axis orientation property. Furthermore, the solid capacity of MgO was almost equivalent to the amount of MgO in the target composition. Also, the crystal phase comprised a perfect perovskite single phase.

Next, pyroelectric coefficient γ, dielectric constant εr, and dielectric loss tanδ of the obtained thin film were measured. Tables 1 and 2 show pyroelectric coefficient γ, dielectric constant εr, and dielectric loss tanδ of the thin film in each composition. Table 2 also indicates a bulk value of $PbTiO_3$.

TABLE 1

The pyroelectric coefficient γ, dielectric constant ε r, and dielectric loss tan δ of a ferroelectic thin film having a composition of [(1 − x) · $Pb_{1-y}La_yTi_{1-y/4}O_3$ + x · MgO] (x = 0–0.10, y = 0.05–0.25)
(One kind of target)

| Composition<br>(1 − x) · $Pb_{1-y}La_yTi_{1-y/4}O_3$ + x · MgO | | pyroelectric coefficient γ<br>(C/cm$^2$K) | dielectric constant ε r | dielectric loss tan δ (%) |
|---|---|---|---|---|
| X = 0 | Y = 0.05 | 4.0 × 10$^{-8}$ | 170 | 0.8 |
| X = 0.01 | Y = 0.05 | 4.2 × 10$^{-8}$ | 150 | 0.6 |
| X = 0.02 | Y = 0.05 | 6.0 × 10$^{-8}$ | 135 | 0.6 |
| X = 0.04 | Y = 0.05 | 7.5 × 10$^{-8}$ | 110 | 0.5 |
| X = 0.06 | Y = 0.05 | 7.0 × 10$^{-8}$ | 115 | 0.5 |
| X = 0.08 | Y = 0.05 | 7.2 × 10$^{-8}$ | 120 | 0.5 |
| X = 0.10 | Y = 0.05 | 6.8 × 10$^{-8}$ | 135 | 0.4 |
| X = 0 | Y = 0.10 | 5.0 × 10$^{-8}$ | 220 | 1.0 |
| X = 0.01 | Y = 0.10 | 5.5 × 10$^{-8}$ | 200 | 0.8 |
| X = 0.02 | Y = 0.10 | 7.5 × 10$^{-8}$ | 180 | 0.6 |
| X = 0.04 | Y = 0.10 | 9.0 × 10$^{-8}$ | 160 | 0.6 |
| X = 0.06 | Y = 0.10 | 9.5 × 10$^{-8}$ | 140 | 0.5 |
| X = 0.08 | Y = 0.10 | 9.2 × 10$^{-8}$ | 145 | 0.5 |
| X = 0.10 | Y = 0.10 | 9.0 × 10$^{-8}$ | 150 | 0.6 |

TABLE 2

The pyroelectric coefficient γ, dielectric constant ε r, and dielectric loss tan δ of a ferroelectic thin film having a composition of [(1 − x) · $Pb_{1-y}La_yTi_{1-y/4}O_3$ + x · MgO] (x = 0–0.10, y = 0.05–0.25)
(One kind of target)

| Composition<br>(1 − x) · $Pb_{1-y}La_yTi_{1-y/4}O_3$ + x · MgO | | pyroelectric coefficient γ<br>(C/cm$^2$K) | dielectric constant ε r | dielectric loss tan δ (%) |
|---|---|---|---|---|
| X = 0 | Y = 0,15 | 6.5 × 10$^{-8}$ | 310 | 1.1 |
| X = 0.01 | Y = 0.15 | 7.8 × 10$^{-8}$ | 300 | 0.9 |
| X = 0.02 | Y = 0.15 | 9.8 × 10$^{-8}$ | 270 | 0.6 |
| X = 0.04 | Y = 0.15 | 12 × 10$^{-8}$ | 240 | 0.8 |
| X = 0.06 | Y = 0.15 | 13 × 10$^{-8}$ | 210 | 0.7 |
| X = 0.08 | Y = 0.15 | 12 × 10$^{-8}$ | 195 | 0.6 |
| X = 0.10 | Y = 0.15 | 10 × 10$^{-8}$ | 205 | 0.6 |

TABLE 2-continued

The pyroelectric coefficient γ, dielectric constant ε r, and dielectric loss tan δ of a ferroelectric thin film having a composition of [(1 − x) · $Pb_{1-y}La_yTi_{1-y/4}O_3$ + x · MgO] (x = 0–0.10, y = 0.05–0.25)
(One kind of target)

| Composition<br>(1 − x) · $Pb_{1-y}La_yTi_{1-y/4}O_3$ + x · MgO | | pyroelectric<br>coefficient γ<br>(C/cm²K) | dielectric<br>constant ε r | dielectric<br>loss tan δ (%) |
|---|---|---|---|---|
| X = 0    | Y = 0.20 | 9.5 × 10⁻⁸ | 600  | 1.2 |
| X = 0.01 | Y = 0.20 | 11 × 10⁻⁸  | 530  | 1.0 |
| X = 0.02 | Y = 0.20 | 14 × 10⁻⁸  | 455  | 0.8 |
| X = 0.04 | Y = 0.26 | 16 × 10⁻⁸  | 410  | 0.7 |
| X = 0.06 | Y = 0.20 | 17 × 10⁻⁸  | 380  | 0.8 |
| X = 0.08 | Y = 0.20 | 18 × 10⁻⁸  | 355  | 0.6 |
| X = 0.10 | Y = 0.20 | 16 × 10⁻⁸  | 470  | 0.7 |
| X = 0    | Y = 0.25 | 6.0 × 10⁻⁸ | 1500 | 1.5 |
| X = 0.01 | Y = 0.25 | 7.0 × 10⁻⁸ | 1050 | 1.2 |
| X = 0.02 | Y = 0.25 | 8.0 × 10⁻⁸ | 880  | 1.2 |
| X = 0.04 | Y = 0.25 | 10 × 10⁻⁸  | 715  | 1.0 |
| X = 0.06 | Y = 0.25 | 12 × 10⁻⁸  | 620  | 0.8 |
| X = 0.08 | Y = 0.25 | 11 × 10⁻⁸  | 650  | 0.8 |
| X = 0.10 | Y = 0.25 | 10 × 10⁻⁸  | 865  | 0.8 |
| $PbTiO_3$ (bulk) | | 2.0 × 10⁻⁸ | 190  | 0.8 |

As clearly shown in the above-noted Tables 1 and 2, when the added amount y of La was varied from 0.05 to 0.25 and the added amount x of MgO was varied from 0.01 to 0.10, it was confirmed that the sample had a larger γ and smaller εr and tanδ compared with samples of x=o and with the bulk value.

As described above, it was confirmed that a ferroelectric thin film comprising the composition of this invention is an extremely excellent material which has improved γ and reduced εr and tanδ, when comparing these values with those of thin films having a composition outside the scope of this invention, and also compared with the bulk value of conventional $PbTiO_3$.

Figure 4:
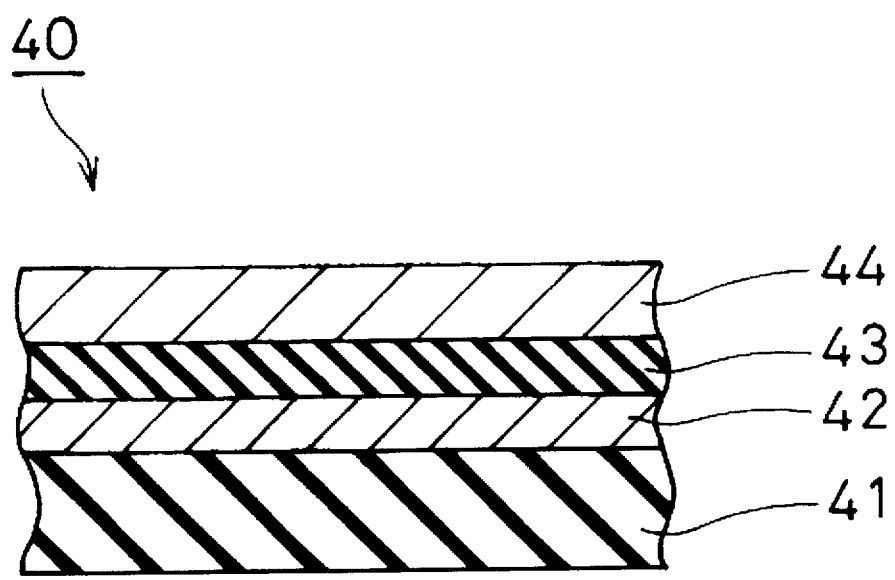
FIG. 4 is a schematic cross-sectional view showing a pyroelectric infrared sensor element with use of a ferroelectric thin film in Example 1 of this invention.
Figure 5:
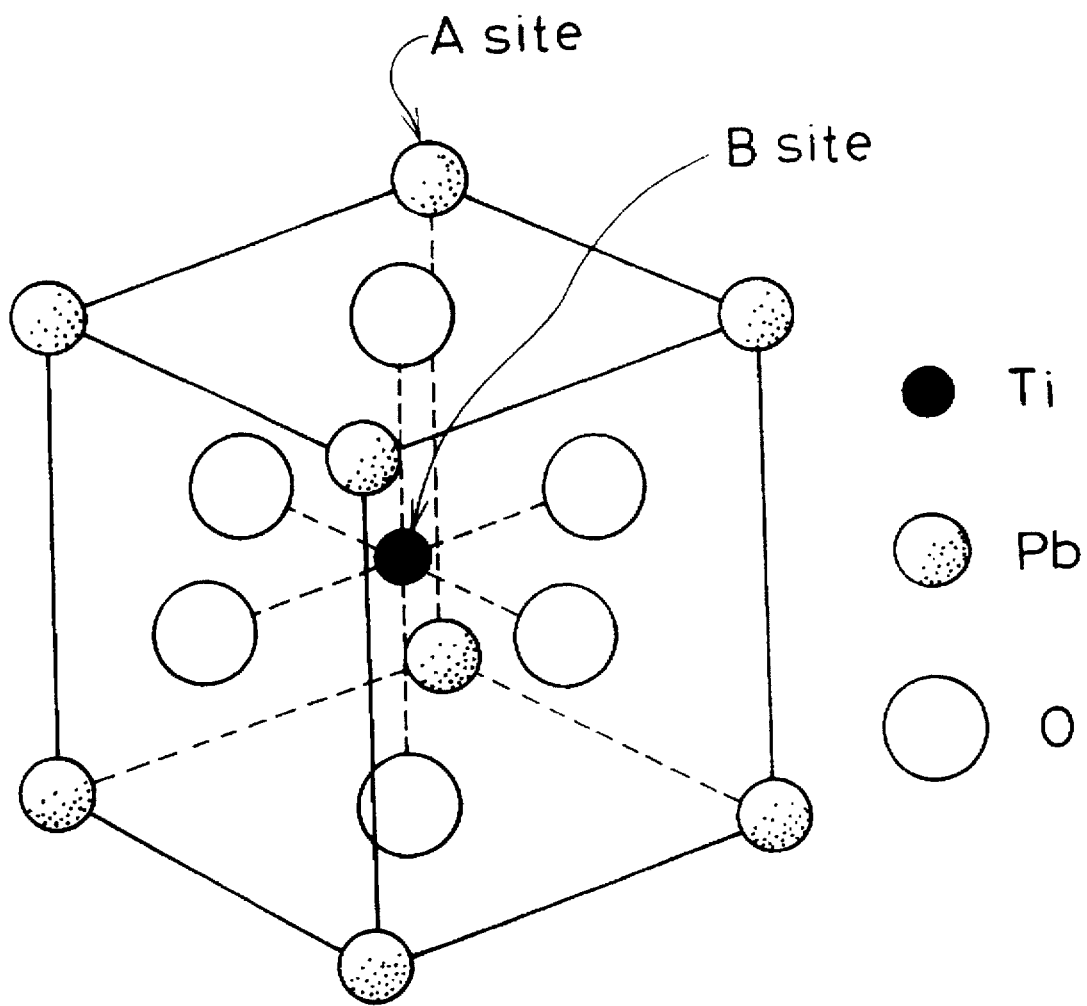
FIG. 5 is a model view showing an oxygen atom octahedron in a perovskite crystal structure of $PbTiO_3$.

Next, FIG. 4 shows a ferroelectric thin film of this invention used as a pyroelectric material of a pyroelectric infrared sensor. In FIG. 4, reference numeral 40 represents a pyroelectric infrared sensor element; 41 represents a MgO single crystal substrate of 0.5 mm thick; 42 represents a Pt lower electrode of 100 nm thick; 43 represents a ferroelectric thin film having a thickness of 1 μm and composed of [0.96($Pb_{0.9}La_{0.1}Ti_{0.975}O_3$)+0.04 MgO]; and 44 represents a Ni—Cr upper electrode of 50 nm thick. According to this structure, the pyroelectric infrared sensor element has a high c-axis orientation property while the film is formed, and it is also unnecessary to conduct a polarization process as with a bulk crystal.

EXAMPLE 2

A method of manufacturing the ferroelectric thin film is as follows.

As shown in FIG. 1, the ferroelectric thin film of this invention is manufactured by a high frequency magnetron sputtering method. First, target 1 used for sputtering was manufactured in the following method.

PbO, $La_2O_3$, $TiO_2$, and $MnO_2$ in powder form were mixed to attain a target composition comprising {(1-z)·$Pb_{1-y}La_yTi_{1-y/4}O_3$+z·MnO} (y=0.05–0.25, z=0.002–0.05). Then, the mixed powder was calcined four hours at a temperature of 750° C. and smashed. Or, PbO, $La_2O_3$, $TiO_2$, and $MnO_2$ in powder form were mixed to attain {(1-z)(1-y)·PbO+(1-z)y/2·$La_2O_3$+(1-z)(1-y/4)·$TiO_2$+z·$MnO_2$} and smashed. To each of these powders, PbO powder with an excess of 5 to 40 mol % was mixed to prevent a Pb deficiency and to attain [(1-w)·{(1-z)·$Pb_{1-y}La_yTi_{1-y/4}O_3$+z·$MnO_2$}+w·PbO] or [(1-w)·{(1-z)·(1-y)·PbO+(1-z)y/2·$La_2O_3$+(1-z)(1-y/4)·$TiO_2$+z·$MnO_2$}+w·PbO] (y=0.05–0.25, z=0.002–0.05, w=0.05–0.40). After 30 g of each powder was filled in target plate 2, a face pressure of about 250 kgf/cm² was provided with a hydraulic press to form target 1. The thin films obtained in these two different manufacturing methods showed equal characteristics.

Next, target plate 2 was placed on top of magnet 3, and cover 4 was placed thereon. Here, magnet 3 and high frequency electrode 5 disposed under the magnet are insulated from vacuum chamber 7 by insulator 6. Also, high frequency electrode 5 is connected to high frequency electric power source 8.

Substrate 9 of the thin film comprised a MgO single crystal substrate (20 mm×20 mm, thickness 0.5 mm) oriented to (100). On one side of substrate 9, a foundation electrode composed of platium which had been priority oriented to (100) was formed by a sputtering method and was patterned. After substrate 9 was positioned on substrate heater 10, a stainless metal mask 11 (0.2 mm thick) was disposed on the surface of substrate 9. Then, chamber 7 was exhausted, and substrate 9 was heated up to 600° C. by substrate heater 10. Substrate heater 10 was rotated by motor 15. After the heating step, valves 12 and 13 were opened to let in sputter gas of Ar and $O_2$ in a ratio of 9:1 through nozzle 14 into chamber 7 where a degree of vacuum was maintained at 0.5 Pa. Then, when a high frequency electric power of 2.1 W/cm² (13.56 MHz) was input from high frequency electric power source 8 to generate plasma, a film was formed on substrate 9. In this way, a ferroelectric thin film composed of [(1-z)·$Pb_{1-y}La_yTi_{1-y/4}O_3$+z·$MnO_2$] (y=0.05–0.25, z=0.002–0.05) was produced. The thin film obtained had a thickness of about 0.95 μm after five hours of deposition time. On top of this ferroelectric thin film, a Ni—Cr electrode was formed by a DC sputtering method for the purpose of measurement and was patterned.

When this thin film was obtained, the solid capacity of each element was measured by an x-ray microanalyzer, and the crystal phase and the c-axis orientation rate a (=I(001) /{I(001)+I(100)}) were measured by an x-ray diffracting method. As a result, the solid capacity of MgO was almost equivalent to the amount of MgO in the target composition. Furthermore, the crystal phase comprised a perfect perovskite single phase in which only (001), (100), and their high-order peaks were confirmed. Based on this result, when $\alpha$ was calculated, an as-grown thin film was in the range of $0.84 \leq \alpha \leq 1.00$ and showed a high c-axis orientation property.

Next, pyroelectric coefficient $\gamma$, dielectric constant $\epsilon r$, and dielectric loss $\tan\delta$ of this thin film were measured. Tables 3 and 4 show pyroelectric coefficient $\gamma$, dielectric constant $\epsilon r$, and dielectric loss $\tan\delta$ of the obtained thin film in each composition. Table 4 also indicates the bulk value of $PbTiO_3$.

As clearly shown in the above-noted Tables 3 and 4, when the added amount y of La was varied from 0.05 to 0.25 and the added amount z of $MnO_2$ was varied from 0.002 to 0.05, it was confirmed that the sample had a larger $\gamma$ and smaller $\epsilon r$ and $\tan\delta$ compared with samples of $z=0$ and with the bulk value.

As described above, a thin film comprising the composition of this invention is a remarkably extremely excellent material which has improved $\gamma$ and reduced $\epsilon r$ and $\tan\delta$, when comparing these values with those of thin films having a composition outside the scope of this invention, and also compared with the bulk value of conventional $PbTiO_3$.

EXAMPLE 3

Figure 2:
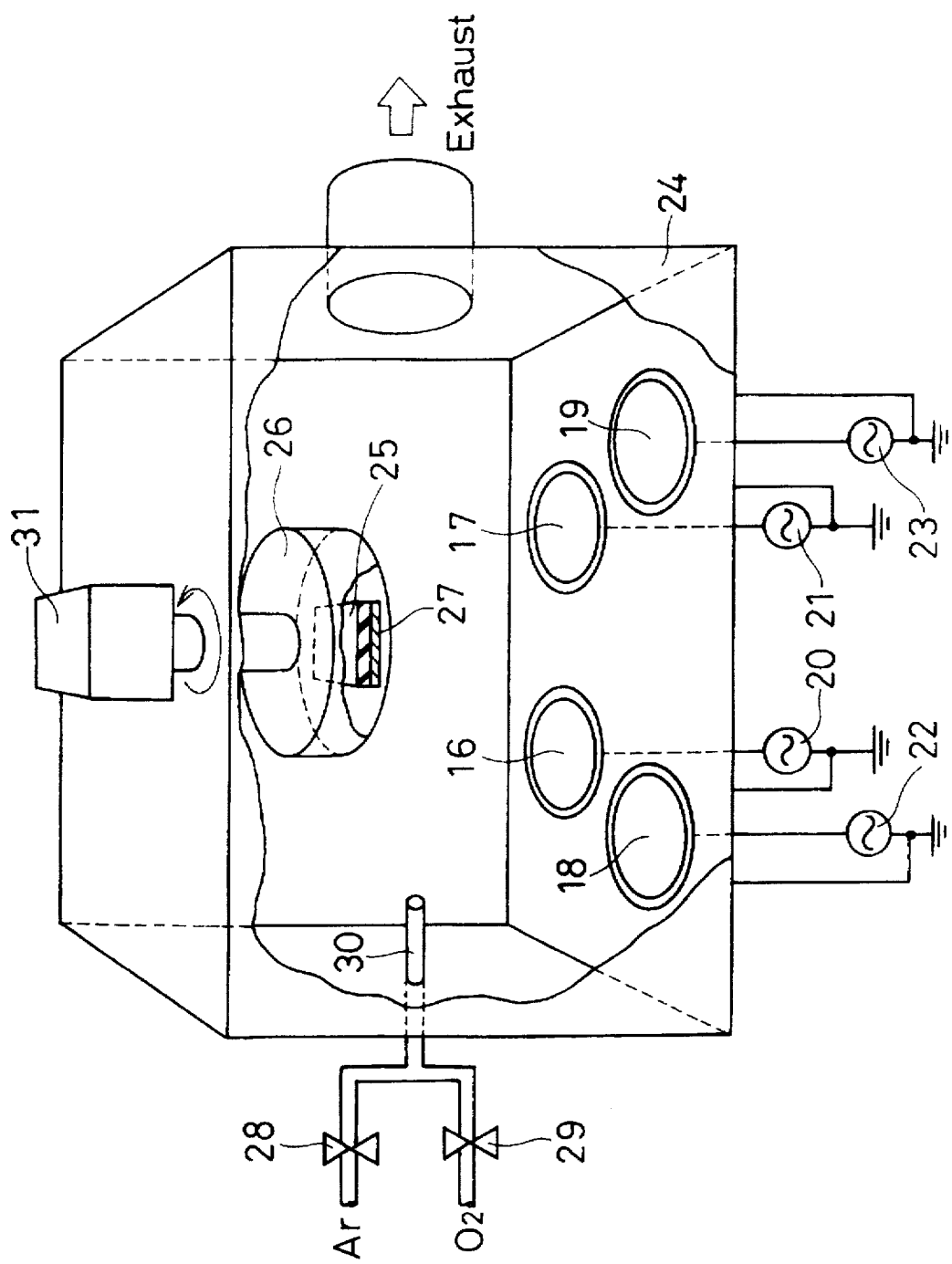
FIG. 2 is a schematic view showing a manufacturing apparatus of a ferroelectric thin film which is used for embodiments of this invention.

In FIG. 2, reference numerals 16, 17, 18, and 19 represent targets; 20, 21, 22, and 23, high frequency electric power

TABLE 3

The pyroelectric coefficient $\gamma$, dielectric constant $\epsilon r$, and dielectric loss $\tan\delta$ of a ferroelectic thin film having a composition of $[(1 - z) \cdot Pb_{1-y}La_yTi_{1-y/4}O_3 + z \cdot MnO_2]$ (y = 0.05–0.25, z = 0–0.05) (One kind of target)

| Composition $(1 - z) \cdot Pb_{1-y}La_yTi_{1-y/4}O_3 + x \cdot MnO_2$ | | pyroelectric coefficient $\gamma$ (C/cm$^2$K) | dielectric constant $\epsilon r$ | dielectric loss tan $\delta$ (%) |
|---|---|---|---|---|
| Y = 0.05 | z = 0 | 4.0 × 10$^{-8}$ | 175 | 0.8 |
| Y = 0.05 | z = 0.002 | 5.2 × 10$^{-8}$ | 130 | 0.8 |
| Y = 0.05 | z = 0.005 | 6.8 × 10$^{-8}$ | 120 | 0.6 |
| Y = 0.05 | z = 0.01 | 7.3 × 10$^{-8}$ | 115 | 0.5 |
| Y = 0.05 | z = 0.02 | 6.9 × 10$^{-8}$ | 125 | 0.6 |
| Y = 0.05 | z = 0.03 | 5.7 × 10$^{-8}$ | 140 | 0.6 |
| Y = 0.05 | z = 0.05 | 5.2 × 10$^{-8}$ | 155 | 0.7 |
| Y = 0.10 | z = 0 | 5.0 × 10$^{-8}$ | 220 | 1.0 |
| Y = 0.10 | z = 0.002 | 6.8 × 10$^{-8}$ | 195 | 0.9 |
| Y = 0.10 | z = 0.005 | 7.6 × 10$^{-8}$ | 150 | 0.7 |
| Y = 0.10 | z = 0.01 | 9.2 × 10$^{-8}$ | 140 | 0.6 |
| Y = 0.10 | z = 0.02 | 8.9 × 10$^{-8}$ | 155 | 0.6 |
| Y = 0.10 | z = 0.03 | 8.1 × 10$^{-8}$ | 170 | 0.6 |
| Y = 0.10 | z = 0.05 | 7.2 × 10$^{-8}$ | 190 | 0.8 |
| Y = 0.15 | z = 0 | 6.7 × 10$^{-8}$ | 305 | 1.2 |
| Y = 0.15 | z = 0.002 | 8.6 × 10$^{-8}$ | 280 | 1.0 |
| Y = 0.15 | z = 0.005 | 10 × 10$^{-8}$ | 240 | 0.8 |
| Y = 0.15 | z = 0.01 | 12 × 10$^{-8}$ | 200 | 0.6 |
| Y = 0.15 | z = 0.02 | 11 × 10$^{-8}$ | 225 | 0.6 |
| Y = 0.15 | z = 0.03 | 9.5 × 10$^{-8}$ | 250 | 0.7 |
| Y = 0.15 | z = 0.05 | 8.3 × 10$^{-8}$ | 275 | 0.9 |

TABLE 4

The pyroelectric coefficient $\gamma$, dielectric constant $\epsilon r$, and dielectric loss $\tan\delta$ of a ferroelectic thin film having a composition of $[(1 - z) \cdot Pb_{1-y}La_yTi_{1-y/4}O_3 + z \cdot MnO_2]$ (y = 0.05–0.25, z = 0–0.05) (One kind of target)

| Composition $(1 - x) \cdot Pb_{1-y}La_yTi_{1-y/4}O_3 + x \cdot MnO_2$ | | pyroelectric coefficient $\gamma$ (C/cm$^2$K) | dielectric constant $\epsilon r$ | dielectric loss tan $\delta$ (%) |
|---|---|---|---|---|
| Y = 0.20 | z = 0 | 9.6 × 10$^{-8}$ | 610 | 1.3 |
| Y = 0.20 | z = 0.002 | 12 × 10$^{-8}$ | 455 | 1.1 |
| Y = 0.20 | z = 0.005 | 15 × 10$^{-8}$ | 375 | 1.0 |
| Y = 0.20 | z = 0.01 | 17 × 10$^{-8}$ | 345 | 0.8 |
| Y = 0.20 | z = 0.02 | 15 × 10$^{-8}$ | 380 | 0.7 |
| Y = 0.20 | z = 0.03 | 13 × 10$^{-8}$ | 435 | 0.8 |
| Y = 0.20 | z = 0.05 | 12 × 10$^{-8}$ | 470 | 1.0 |
| Y = 0.25 | z = 0 | 5.9 × 10$^{-8}$ | 1450 | 1.6 |
| Y = 0.25 | z = 0.002 | 7.2 × 10$^{-8}$ | 1050 | 1.3 |
| Y = 0.25 | z = 0.005 | 9.5 × 10$^{-8}$ | 870 | 1.0 |
| Y = 0.25 | z = 0.01 | 12 × 10$^{-8}$ | 620 | 0.8 |
| Y = 0.25 | z = 0.02 | 10 × 10$^{-8}$ | 755 | 0.9 |
| Y = 0.25 | z = 0.03 | 9.2 × 10$^{-8}$ | 890 | 1.1 |
| Y = 0.25 | z = 0.05 | 8.0 × 10$^{-8}$ | 945 | 1.2 |
| PbTiO$_3$ (bulk) | | 2.0 × 10$^{-8}$ | 190 | 0.8 | sources; 24, a vacuum chamber; 25, a substrate; 26, a substrate heater; 27, a metal mask; 28 and 29, valves; 30, a nozzle for providing sputter gas into vacuum chamber 24; and 31, a motor for rotating substrate heater 26. In this figure, elements in the vicinity of the target, such as cover, electrode, insulator, and magnet described in FIG. 1 are omitted.

A method of manufacturing the ferroelectric thin film is as follows.

As shown in FIG. 2, the ferroelectric thin film of this invention was manufactured by a polyphyletic high frequency magnetron sputtering method having four targets. These four targets form a concentric circle and are equidistance from the substrate disposed in the center of the heater. As for targets used for sputtering, two different kinds of target were used; that is, target 16, (Pb, La)TiO$_3$ powder, and target 17, MgO ceramics. Among them, target 16 of (Pb, La)TiO$_3$ powder was formed by the following method.

PbO, La$_2$O$_3$, and TiO$_2$, in powder form were mixed to attain a target composition comprising Pb$_{1-y}$La$_y$Ti$_{1-y/4}$O$_3$ (y=0.05~0.25) Then, the mixed powder was calcined four hours at a temperature of 750° C. and smashed. Or, PbO, La$_2$O$_3$, and TiO$_2$ in powder form were mixed to attain (1-y)·PbO+(1-z)y/2·La$_2$O$_3$+(1-y/4)·TiO$_2$ and smashed. To each of these powders, PbO powder with an excess of 5 to 40 mol % was mixed respectively to prevent Pb from lacking and to attain [(1-w)·Pb$_{1-y}$La$_y$Ti$_{1-y/4}$O$_3$+w·PbO] or [(1-w)·{(1-y)·PbO+y/2·La$_2$O$_3$+(1-y/4)·TiO$_2$}+w·PbO] (y=0.05~0.25, w=0.05~0.40). After 30 g of each powder was filled in a target plate, a face pressure of about 250 kgf/cm$^2$ was provided with a hydraulic press to form target 16. The thin films obtained at target 16 by means of these two different manufacturing methods showed equal characteristics. Target 16 and ceramic target 17 composed of MgO ceramics were positioned in chamber 24. In addition, targets 16 and 17 are respectively connected to high frequency electric power sources 20 and 21.

Substrate 25 comprised a MgO single crystal substrate (20 mm×20 mm, thickness 0.5 mm) oriented to (100). On one side of substrate 25, a foundation electrode composed of platinum which had been priority oriented to (100) was formed by a sputtering method and was patterned. After substrate 25 was positioned on substrate heater 26, stainless metal mask 27 of 0.2 mm thick was disposed on the surface of substrate 25. Then, chamber 24 was exhausted, and substrate 25 was heated up to 600° C. by substrate heater 26. After the heating step, substrate heater 26 was rotated by motor 31, and valves 28 and 29 were opened to let in sputtering gases Ar and O$_2$ in a ratio of 9:1 through nozzle 30 into chamber 24 where the degree of vacuum was maintained at 0.5 Pa. Then, high frequency electric power was input from high frequency electric power sources 20 and 21 into targets 16 and 17 to generate plasma, and a film was formed on substrate 25. As for this high frequency electric power input, high frequency electric power source 20 of target 16 was fixed at 2.1 W/cm$^2$ (13.56 MHz), and high frequency electric power source 21 of target 17 was varied optionally from 0 W to 1.2 W/cm$^2$ (13.56 MHz). By doing so, the added amount of MgO was controlled. In this way, a ferroelectric thin film composed of [(1-x)·Pb$_{1-y}$La$_y$Ti$_{1-y/4}$O$_3$+x·MgO] (x=0.01~0.10, y=0.05~0.25) was produced. The thin film obtained had a thickness of about 1.2 µm after five hours of deposition time. On top of this ferroelectric thin film, a Ni—Cr electrode was formed as an upper electrode by a DC sputtering method for the purpose of measurement and was patterned.

When this thin film was obtained, the solid capacity of each element was measured by an x-ray microanalyzer, and the crystal phase and c-axis orientation rate α (=I(001)/{I(001)+I(100)}) were measured by an x-ray diffracting method. As a result, the crystal phase comprised a perfect perovskite single phase in which only (001), (100), and their high-order peaks were confirmed. Based on this result, when α was calculated, an as-grown thin film was in the range of 0.84≦α≦1.00 and showed a high c-axis orientation property.

Next, pyroelectric coefficient γ, dielectric constant εr, and dielectric loss tanδ of the obtained thin film were measured between the foundation electrode and the upper electrode. Tables 5 and 6 show pyroelectric coefficient γ, dielectric constant εr, and dielectric loss tanδ of the thin film in each composition. Table 6 also indicates the bulk value of PbTiO$_3$.

TABLE 5

The pyroelectric coefficient γ, dielectric constant ε r, and dielectric loss tan δ of a ferroelectic thin film having a composition of [(1 − x) · Pb$_{1-y}$La$_y$Ti$_{1-y/4}$O$_3$ + x · MgO] (x = 0–0.10, y = 0.05–0.25) (Two kinds of target)

| Composition (1 − x) · Pb$_{1-y}$La$_y$Ti$_{1-y/4}$O$_3$ + x · MgO | | pyroelectric coefficient γ (C/cm$^2$K) | dielectric constant ε r | dielectric loss tan δ (%) |
|---|---|---|---|---|
| X = 0 | Y = 0.05 | 3.9 × 10$^{-8}$ | 175 | 0.9 |
| X = 0.01 | Y = 0.05 | 4.5 × 10$^{-8}$ | 150 | 0.7 |
| X = 0.02 | Y = 0.05 | 5.8 × 10$^{-8}$ | 140 | 0.6 |
| X = 0.04 | Y = 0.05 | 7.4 × 10$^{-8}$ | 115 | 0.5 |
| X = 0.06 | Y = 0.05 | 7.5 × 10$^{-8}$ | 115 | 0.4 |
| X = 0.08 | Y = 0.05 | 7.2 × 10$^{-8}$ | 125 | 0.4 |
| X = 0.10 | Y = 0.05 | 6.5 × 10$^{-8}$ | 140 | 0.5 |
| X = 0 | Y = 0.10 | 5.1 × 10$^{-8}$ | 230 | 1.1 |
| X = 0.01 | Y = 0.10 | 5.8 × 10$^{-8}$ | 205 | 0.8 |
| X = 0.02 | Y = 0.10 | 7.3 × 10$^{-8}$ | 175 | 0.7 |
| X = 0.04 | Y = 0.10 | 8.8 × 10$^{-8}$ | 155 | 0.6 |
| X = 0.06 | Y = 0.10 | 9.2 × 10$^{-8}$ | 140 | 0.6 |
| X = 0.08 | Y = 0.10 | 9.0 × 10$^{-8}$ | 145 | 0.5 |
| X = 0.10 | Y = 0.10 | 8.8 × 10$^{-8}$ | 155 | 0.6 |
| X = 0 | Y = 0.15 | 6.3 × 10$^{-8}$ | 320 | 1.2 |
| X = 0.01 | Y = 0.15 | 7.7 × 10$^{-8}$ | 305 | 0.9 |
| X = 0.02 | Y = 0.15 | 9.5 × 10$^{-8}$ | 280 | 0.8 |
| X = 0.04 | Y = 0.15 | 11 × 10$^{-8}$ | 245 | 0.7 |
| X = 0.06 | Y = 0.15 | 12 × 10$^{-8}$ | 215 | 0.6 |

TABLE 5-continued

The pyroelectric coefficient γ, dielectric constant ε r, and dielectric loss tan δ of a ferroelectic thin film having a composition of [(1 − x) · $Pb_{1-y}La_yTi_{1-y/4}O_3$ + x · MgO] (x = 0–0.10, y = 0.05–0.25)
(Two kinds of target)

| Composition (1 − x) · $Pb_{1-y}La_yTi_{1-y/4}O_3$ + x · MgO | | pyroelectric coefficient γ (C/cm²K) | dielectric constant ε r | dielectric loss tan δ (%) |
|---|---|---|---|---|
| X = 0.08 | Y = 0.15 | 10 × 10⁻⁸ | 190 | 0.6 |
| X = 0.10 | Y = 0.15 | 9.5 × 10⁻⁸ | 210 | 0.7 |

TABLE 6

The pyroelectric coefficient γ, dielectric constant ε r, and dielectric loss tan δ of a ferroelectic thin film having a composition of [(1 − x) · $Pb_{1-y}La_yTi_{1-y/4}O_3$ + x · MgO] (x = 0–0.10, y = 0.05–0.25)
(Two kinds of target)

| Composition (1 − x) · $Pb_{1-y}La_yTi_{1-y/4}O_3$ + x · MgO | | pyroelectric coefficient γ (C/cm²K) | dielectric constant ε r | dielectric loss tan δ (%) |
|---|---|---|---|---|
| X = 0 | Y = 0.20 | 9.2 × 10⁻⁸ | 595 | 1.5 |
| X = 0.01 | Y = 0.20 | 10 × 10⁻⁸ | 535 | 1.0 |
| X = 0.04 | Y = 0.20 | 15 × 10⁻⁸ | 410 | 0.8 |
| X = 0.06 | Y = 0.20 | 17 × 10⁻⁸ | 375 | 0.7 |
| X = 0.08 | Y = 0.20 | 17 × 10⁻⁸ | 360 | 0.6 |
| X = 0.10 | Y = 0.20 | 15 × 10⁻⁸ | 450 | 0.7 |
| X = 0 | Y = 0.25 | 5.9 × 10⁻⁸ | 1420 | 1.6 |
| X = 0.01 | Y = 0.25 | 7.2 × 10⁻⁸ | 1010 | 1.3 |
| X = 0.02 | Y = 0.25 | 8.5 × 10⁻⁸ | 850 | 1.2 |
| X = 0.04 | Y = 0.25 | 9.8 × 10⁻⁸ | 715 | 1.0 |
| X = 0.06 | Y = 0.25 | 11 × 10⁻⁸ | 620 | 0.8 |
| X = 0.08 | Y = 0.25 | 10 × 10⁻⁸ | 660 | 0.7 |
| X = 0.10 | Y = 0.25 | 9.2 × 10⁻⁸ | 880 | 0.8 |
| PbTiO₃ (bulk) | | 2.0 × 10⁻⁸ | 190 | 0.8 |

As clearly shown in the above-noted Tables 5 and 6, when the added amount y of La was varied from 0.05 to 0.25 and the added amount x of MgO was varied from 0.01 to 0.10, it was confirmed that the sample had a larger γ and smaller εr and tanδ compared with samples of x=o and with the bulk value.

As described above, a ferroelectric thin film comprising the composition of this invention is an extremely excellent material which has improved γ and reduced εr and tanδ, when comparing these values with those of thin films having a composition outside the scope of this invention, and also compared with the bulk value of conventional PbTiO₃.

In this embodiment, the target used for sputtering was a MgO ceramic target. However, it was confirmed that the same results could be attained by using a metal Mg as target and by letting in sputtering gases Ar and O₂ in a ratio of 9:3 into the chamber. Furthermore, although the targets used for sputtering in this embodiment comprised two different kinds, namely, [(1-w)·Pb₁₋ᵧLaᵧTi₁₋ᵧ/₄O₃+w·PbO] or [(1-w)·{(1-y)·PbO+y/2·La₂O₃+(1-y/4)·TiO₂}+w·PbO] (y=0.05–0.25, w=0.05–0.40) and a MgO target, it was also confirmed that the same results could be attained by combining two different kinds of targets consisting of [(1-w)·{(1-x)·PbTiO₃+x·MgO}+w·PbO] or [(1-w)·{(1-x)(PbO+TiO₂)+x·MgO}+w·PbO] (x=0.01–0.10, w=0.05–0.40) and a La₂O₃ target, or by combining two different kinds of targets consisting of [(1-x)·Pb₁₋ᵧLaᵧTi₁₋ᵧ/₄O₃+x·MgO] or [(1-x)(1-y)·PbO+(1-x)y/2·La₂O₃+(1-x)(1-y/4)·TiO₂}+x·MgO] (x=0.01–0.10, y=0.05–0.25) and a PbO target.

EXAMPLE 4

A method of manufacturing the ferroelectric thin film is as follows.

As shown in FIG. 2, the ferroelectric thin film of this invention was manufactured by a polyphyletic high frequency magnetron sputtering method having four targets. These four targets formed a concentric circle and are equidistant from the substrate disposed in the center of the heater. As for targets used for sputtering, two different kinds of target were used; that is, target 16, (Pb, La)TiO₃ powder, and target 17, MnO₂ ceramic. Among them, target 16 of (Pb, La)TiO₃ powder was formed in the following method.

PbO, La₂O₃, and TiO₂, in powder form were mixed to attain a target composition comprising Pb₁₋ᵧLaᵧTi₁₋ᵧ/₄O₃ (y=0.05–0.25). Then, the mixed powder was calcined four hours at a temperature of 750° C. and smashed. Or, PbO, La₂O₃, and TiO₂ in powder form were mixed to attain (1-y)·PbO+(1-z)y/2·La₂O₃+(1-y/4)·TiO₂ and smashed. To each of these powders, PbO powder with an excess of 5 to 40 mol % was mixed respectively to prevent a Pb deficiency and to attain [(1-w)·Pb₁₋ᵧLaᵧTi₁₋ᵧ/₄O₃+w·PbO] or [(1-w)·{(1-y)·PbO+y/2·La₂O₃+(1-y/4)·TiO₂}+w·PbO] (y=0.05–0.25, w=0 05–0.40) After 30 g of this powder was filled in a target plate, a face pressure of about 250 kgf/cm² was provided with a hydraulic press to form target 16. The thin films obtained at target 16 by means of these two different manufacturing methods showed equal characteristics. Target 16 and target 17 composed of MnO₂ ceramics were positioned in chamber 24. Besides, targets 16 and 17 are respectively connected to high frequency electric power sources 20 and 21.

Substrate 25 comprised a MgO single crystal substrate (20 mm×20 mm, thickness 0.5 mm) oriented to (100). On one side of substrate 25, a foundation electrode composed of platinum which had been priority oriented to (100) was formed by sputtering and was patterned. After substrate 25 was positioned on substrate heater 26, stainless metal mask 27 of 0.2 mm thick was disposed on the surface of substrate 25. Then, chamber 24 was exhausted, and substrate 25 was heated up to 600° C. by substrate heater 26. After the heating step, substrate heater 26 was rotated by motor 31, and valves 28 and 29 were opened to let in sputtering gases Ar and $O_2$ in a ratio of 9:1 through nozzle 30 into chamber 24 where the degree of vacuum was maintained at 0.5 Pa. Then, high frequency electric power was input from high frequency electric power sources 20 and 21 into targets 16 and 17 to generate plasma, and a film was formed on substrate 25. As for this high frequency electric power input, high frequency electric power source 20 of target 16 was fixed at 2.1 W/cm² (13.56 MHz), and high frequency electric power source 21 of target 17 was varied optionally from 0 W to 0.7 W/cm² (13.56 MHz). By doing so, an additive amount of $MnO_2$ was controlled. In this way, a ferroelectric thin film composed of $[(1-z) \cdot Pb_{1-y}La_yTi_{1-y/4}O_3 + z \cdot MnO_2]$ (y=0.05~0.25, z=0.002~0.05) was produced. The thin film obtained had a thickness of about 1.15 µm after five hours of deposition time. On top of this ferroelectric thin film, a Ni—Cr electrode was formed as an upper electrode by a DC sputtering method for the purpose of measurement and was patterned.

When this thin film was obtained, the solid capacity of each element was measured by an x-ray microanalyzer, and the crystal phase and c-axis orientation rate $\alpha$ (=I(001)/{I(001)+I(100)}) were measured by an x-ray diffracting method. As a result, the crystal phase comprised a perfect perovskite single phase in which only (001), (100), and their high-order peaks were confirmed. Based on this result, when $\alpha$ was calculated, an as-grown thin film was in the range of $0.85 \leq \alpha \leq 1.00$ and showed a high c-axis orientation property.

Next, pyroelectric coefficient γ, dielectric constant ∈r, and dielectric loss tanδ of the obtained thin film were measured between the foundation electrode and the upper electrode. Tables 7 and 8 show pyroelectric coefficient γ, dielectric constant ∈r, and dielectric loss tanδ of the thin film in each composition. Table 8 also indicates the bulk value of $PbTiO_3$.

TABLE 7

The pyroelectric coefficient γ, dielectric constant ∈r, and dielectric loss tan σ of a ferroelectric thin film having a composition of $[(1-z) \cdot Pb_{1-y}La_yTi_{1-y/4}O_3 + z \cdot MnO_2]$ (y = 0.05~0.25, z = 0~0.05) (Two kinds of target)

| Composition $(1-z) \cdot Pb_{1-y}La_yTi_{1-y/4}O_3 + x \cdot MnO_2$ | | pyroelectric coefficient γ (C/cm²K) | dielectric constant ∈r | dielectric loss tan σ (%) |
|---|---|---|---|---|
| Y = 0.05 | z = 0 | 4.2 × 10⁻⁸ | 180 | 0.8 |
| Y = 0.05 | z = 0.002 | 5.5 × 10⁻⁸ | 140 | 0.7 |
| Y = 0.05 | z = 0.005 | 6.8 × 10⁻⁸ | 125 | 0.7 |
| Y = 0.05 | z = 0.01 | 7.5 × 10⁻⁸ | 110 | 0.6 |
| Y = 0.05 | z = 0.02 | 7.0 × 10⁻⁸ | 130 | 0.6 |
| Y = 0.05 | z = 0.03 | 5.6 × 10⁻⁸ | 145 | 0.7 |
| Y = 0.05 | z = 0.05 | 5.2 × 10⁻⁸ | 160 | 0.8 |
| Y = 0.10 | z = 0 | 5.3 × 10⁻⁸ | 230 | 1.1 |
| Y = 0.10 | z = 0.002 | 7.0 × 10⁻⁸ | 200 | 0.9 |
| Y = 0.10 | z = 0.005 | 7.7 × 10⁻⁸ | 155 | 0.8 |
| Y = 0.10 | z = 0.01 | 9.1 × 10⁻⁸ | 135 | 0.6 |
| Y = 0.10 | z = 0.02 | 8.5 × 10⁻⁸ | 160 | 0.7 |
| Y = 0.10 | z = 0.03 | 7.9 × 10⁻⁸ | 175 | 0.7 |
| Y = 0.10 | z = 0.05 | 6.8 × 10⁻⁸ | 190 | 0.8 |
| Y = 0.15 | z = 0 | 6.8 × 10⁻⁸ | 310 | 1.2 |
| Y = 0.15 | z = 0.002 | 8.9 × 10⁻⁸ | 290 | 0.9 |
| Y = 0.15 | z = 0.005 | 10 × 10⁻⁸ | 250 | 0.8 |
| Y = 0.15 | z = 0.01 | 12 × 10⁻⁸ | 215 | 0.7 |
| Y = 0.15 | z = 0.02 | 11 × 10⁻⁸ | 230 | 0.6 |
| Y = 0.15 | z = 0.03 | 9.6 × 10⁻⁸ | 355 | 0.8 |
| Y = 0.15 | z = 0.05 | 8.6 × 10⁻⁸ | 290 | 0.9 |

TABLE 8

The pyroelectric coefficient γ, dielectric constant ∈r, and dielectric loss tan σ of a ferroelectric thin film having a composition of $[(1-z) \cdot Pb_{1-y}La_yTi_{1-y/4}O_3 + z \cdot MnO_2]$ (y = 0.05~0.25, z = 0~0.05) (Two kinds of target)

| Composition $(1-z) \cdot Pb_{1-y}La_yTi_{1-y/4}O_3 + x \cdot MnO_2$ | | pyroelectric coefficient γ (C/cm²K) | dielectric constant ∈r | dielectric loss tan σ (%) |
|---|---|---|---|---|
| Y = 0.20 | z = 0 | 9.4 × 10⁻⁸ | 630 | 1.2 |
| Y = 0.20 | z = 0.002 | 11 × 10⁻⁸ | 480 | 1.0 |
| Y = 0.20 | z = 0.005 | 14 × 10⁻⁸ | 395 | 0.9 |
| Y = 0.20 | z = 0.01 | 17 × 10⁻⁸ | 355 | 0.8 |
| Y = 0.20 | z = 0.02 | 14 × 10⁻⁸ | 390 | 0.7 |

TABLE 8-continued

The pyroelectric coefficient γ, dielectric constant ε r, and dielectric loss tan σ of a ferroelectric thin film having a composition of $[(1-z) \cdot Pb_{1-y}La_yTi_{1-y/4}O_3 + z \cdot MnO_2]$ (y = 0.05–0.25, z = 0–0.05) (Two kinds of target)

| Composition $(1-z) \cdot Pb_{1-y}La_yTi_{1-y/4}O_3 + x \cdot MnO_2$ | | pyroelectric coefficient γ (C/cm$^2$K) | dielectric constant ε r | dielectric loss tan σ (%) |
|---|---|---|---|---|
| Y = 0.20 | z = 0.03 | 12 × 10$^{-8}$ | 450 | 0.9 |
| Y = 0.20 | z = 0.05 | 10 × 10$^{-8}$ | 480 | 1.0 |
| Y = 0.25 | z = 0 | 6.0 × 10$^{-8}$ | 1500 | 1.5 |
| Y = 0.25 | z = 0.002 | 7.2 × 10$^{-8}$ | 1180 | 1.2 |
| Y = 0.25 | z = 0.005 | 9.4 × 10$^{-8}$ | 920 | 1.0 |
| Y = 0.25 | z = 0.01 | 11 × 10$^{-8}$ | 650 | 0.9 |
| Y = 0.25 | z = 0.02 | 11 × 10$^{-8}$ | 765 | 0.8 |
| Y = 0.25 | z = 0.03 | 9.7 × 10$^{-8}$ | 905 | 1.0 |
| Y = 0.25 | z = 0.05 | 8.5 × 10$^{-8}$ | 970 | 1.1 |
| PbTiO$_3$ (bulk) | | 2.0 × 10$^{-8}$ | 190 | 0.8 |

As clearly shown in the above-noted Tables 7 and 8, when the added amount y of La was varied from 0.05 to 0.25 and the added amount z of MnO$_2$ was varied from 0.002 to 0.05, it was confirmed that the sample had a larger γ and smaller εr and tanδ compared with samples of z=0 and with the bulk value.

As described above, a ferroelectric thin film comprising the composition of this invention is a remarkably excellent material which has improved γ and reduced εr and tanδ, when comparing these values with those of thin films having a composition outside the scope of this invention, and also compared with the bulk value of conventional PbTiO$_3$.

In this embodiment, the target used for sputtering was a MnO$_2$ ceramic target. However, it was confirmed that the same results could be attained by using a metal Mn as target and by letting in sputtering gases Ar and O$_2$ in a ratio of 9:3 into the chamber. Furthermore, although the targets used for sputtering in this embodiment comprised two different kinds, namely, $[(1-w) \cdot Pb_{1-y}La_yTi_{1-y/4}O_3+w \cdot PbO]$ or $[(1-w) \cdot \{(1-y) \cdot PbO+y/2 \cdot La_2O_3+(1-y/4) \cdot TiO_2\}+w \cdot PbO]$ (y=0.05–0.25, w=0.05–0.40) and a MnO$_2$ target, it was also confirmed that the same results could be attained by combining two different kinds of targets consisting of $[(1-w) \cdot \{(1-z) \cdot PbTiO_3+z \cdot MnO_2\}+w \cdot PbO]$ or $[(1-w) \cdot \{(1-z)(PbO+TiO_2)+z \cdot MnO_2\}+w \cdot PbO]$ (z=0.002–0.05, w=0.05–0.40) and a La$_2$O$_3$ target, or by combining two different kinds of targets consisting of $[(1-z) \cdot Pb_{1-y}La_yTi_{1-y/4}O_3+z \cdot MnO_2]$ or $[(1-z)(1-y) \cdot PbO+(1-z)y/2 \cdot La_2O_3+(1-z)(1-y/4) \cdot TiO_2\}+x \cdot MnO_2]$ (y=0.05–0.25, z=0.002–0.05) and a PbO target.

EXAMPLE 5

As in Example 3, the ferroelectric thin film of this invention was manufactured by a polyphyletic high frequency magnetron sputtering method. As for targets used for sputtering, three different kinds of target were used; that is, target 16, [PbTiO$_3$+PbO] powder, target 17, La$_2$O$_3$ ceramics, and target 18, MgO ceramics. Among them, target 16 of (PbTiO$_3$+PbO) powder is composed of $[(1-w) \cdot PbTiO_3+w \cdot PbO]$ or $[(1-w) \cdot (PbO+TiO_2)+w \cdot PbO]$ (w=0.05–0.40). Target 16 was formed with the same method as in Examples 1 to 4.

These three kinds of target 16, 17, and 18 were positioned in chamber 24, and a thin film was formed in the same manner as in Examples 1 to 4 on the surface of MgO single crystal substrate 25 comprising patterned platinum. As for the high frequency electric power input to each target, target 16 of pressed [PbTiO$_3$+PbO] powder was fixed at 2.1 W/cm$^2$ (13.56 MHz), and target 17 of La$_2$O$_3$ ceramics was varied optionally from 0 W to 0.7 W/cm$^2$ (13.56 MHz), and target 18 of MgO ceramics was varied optionally from 0 W to 1.2 W/cm$^2$ (13.56 MHz). By doing so, the added amount of La$_2$O$_3$ and of MgO was controlled. In this way, a ferroelectric thin film composed of $[(1-x) \cdot Pb_{1-y}La_yTi_{1-y/4}O_3+x \cdot MgO]$ (x=0.01–0.10, y=0.05–0.25) was produced. The thin film obtained had a thickness of about 1.3 μm after five hours of deposition time. On top of this ferroelectric thin film, a Ni—Cr electrode was formed as an upper electrode by a DC sputtering method for the purpose of measurement and was patterned.

When this thin film was obtained, the solid capacity of each element was measured by an x-ray microanalyzer, and the crystal phase and c-axis orientation rate α (=I(001)/{I (001)+I(100)}) were measured by an x-ray diffracting method. As a result, the crystal phase comprised a perfect perovskite single phase in which only (001), (100), and their high-order peaks were confirmed. Based on this result, when α was calculated, the as-grown thin film was in the range of 0.85≦α≦1.00 and showed a high c-axis orientation property.

Next, pyroelectric coefficient γ, dielectric constant εr, and dielectric loss tanδ of this thin film were measured between the foundation electrode and the upper electrode. Tables 9 and 10 show pyroelectric coefficient γ, dielectric constant εr, and dielectric loss tanδ of the thin film in each composition. Table 10 also indicates the bulk value of PbTiO$_3$.

TABLE 9

The pyroelectric coefficient $\gamma$, dielectric constant $\epsilon$ r, and dielectric loss tan $\sigma$ of a ferroelectric thin film having a composition of $[(1 - x) \cdot Pb_{1-y}La_yTi_{1-y/4}O_3 + x \cdot MgO]$ (x = 0–0.10, y = 0.05–0.25)
(Three kinds of target)

| Composition $(1 - x) \cdot Pb_{1-y}La_yTi_{1-y/4}O_3 + x \cdot MgO$ | | pyroelectric coefficient $\gamma$ (C/cm$^2$K) | dielectric constant $\epsilon$ r | dielectric loss tan $\sigma$ (%) |
|---|---|---|---|---|
| X = 0 | Y = 0.05 | 3.5 × 10$^{-8}$ | 165 | 1.0 |
| X = 0.01 | Y = 0.05 | 4.0 × 10$^{-8}$ | 155 | 0.8 |
| X = 0.02 | Y = 0.05 | 5.5 × 10$^{-8}$ | 135 | 0.8 |
| X = 0.04 | Y = 0.05 | 6.8 × 10$^{-8}$ | 120 | 0.7 |
| X = 0.06 | Y = 0.05 | 7.2 × 10$^{-8}$ | 110 | 0.6 |
| X = 0.08 | Y = 0.05 | 6.8 × 10$^{-8}$ | 120 | 0.5 |
| X = 0.10 | Y = 0.05 | 6.1 × 10$^{-8}$ | 140 | 0.6 |
| X = 0 | Y = 0.10 | 5.1 × 10$^{-8}$ | 220 | 1.2 |
| X = 0.01 | Y = 0.10 | 5.8 × 10$^{-8}$ | 205 | 1.0 |
| X = 0.02 | Y = 0.10 | 6.9 × 10$^{-8}$ | 185 | 0.9 |
| X = 0.04 | Y = 0.10 | 8.2 × 10$^{-8}$ | 155 | 0.7 |
| X = 0.06 | Y = 0.10 | 8.8 × 10$^{-8}$ | 140 | 0.6 |
| X = 0.08 | Y = 0.10 | 9.0 × 10$^{-8}$ | 150 | 0.6 |
| X = 0.10 | Y = 0.10 | 8.8 × 10$^{-8}$ | 155 | 0.7 |
| X = 0 | Y = 0.15 | 6.3 × 10$^{-8}$ | 315 | 1.3 |
| X = 0.01 | Y = 0.15 | 7.2 × 10$^{-8}$ | 295 | 1.1 |
| X = 0.02 | Y = 0.15 | 9.2 × 10$^{-8}$ | 270 | 0.9 |
| X = 0.04 | Y = 0.15 | 9.8 × 10$^{-8}$ | 235 | 0.8 |
| X = 0.06 | Y = 0.15 | 11 × 10$^{-8}$ | 200 | 0.7 |
| X = 0.08 | Y = 0.15 | 9.8 × 10$^{-8}$ | 195 | 0.8 |
| X = 0.10 | Y = 0.15 | 9.1 × 10$^{-8}$ | 210 | 0.9 |

TABLE 10

The pyroelectric coefficient $\gamma$, dielectric constant $\epsilon$ r, and dielectric loss tan $\sigma$ of a ferroelectric thin film having a composition of $[(1 - x) \cdot Pb_{1-y}La_yTi_{1-y/4}O_3 + z \cdot MgO]$ (x = 0–0.10, y = 0.05–0.25)
(Three kinds of target)

| Composition $(1 - x) \cdot Pb_{1-y}La_yTi_{1-y/4}O_3 + x \cdot MgO$ | | pyroelectric coefficient $\gamma$ (C/cm$^2$K) | dielectric constant $\epsilon$ r | dielectric loss tan $\sigma$ (%) |
|---|---|---|---|---|
| X = 0 | Y = 0.20 | 9.4 × 10$^{-8}$ | 590 | 1.5 |
| X = 0.01 | Y = 0.20 | 10 × 10$^{-8}$ | 525 | 1.3 |
| X = 0.02 | Y = 0.20 | 11 × 10$^{-8}$ | 455 | 1.2 |
| X = 0.04 | Y = 0.20 | 13 × 10$^{-8}$ | 400 | 0.9 |
| X = 0.06 | Y = 0.20 | 14 × 10$^{-8}$ | 370 | 0.8 |
| X = 0.08 | Y = 0.20 | 15 × 10$^{-8}$ | 360 | 0.8 |
| X = 0.10 | Y = 0.20 | 13 × 10$^{-8}$ | 470 | 1.0 |
| X = 0 | Y = 0.25 | 5.5 × 10$^{-8}$ | 1520 | 1.8 |
| X = 0.01 | Y = 0.25 | 6.3 × 10$^{-8}$ | 1070 | 1.5 |
| X = 0.02 | Y = 0.25 | 7.5 × 10$^{-8}$ | 850 | 1.3 |
| X = 0.04 | Y = 0.25 | 8.6 × 10$^{-8}$ | 710 | 1.2 |
| X = 0.06 | Y = 0.25 | 9.5 × 10$^{-8}$ | 605 | 1.0 |
| X = 0.08 | Y = 0.25 | 9.1 × 10$^{-8}$ | 635 | 1.1 |
| X = 0.10 | Y = 0.25 | 8.8 × 10$^{-8}$ | 815 | 1.2 |
| PbTiO$_3$ (bulk) | | 2.0 × 10$^{-8}$ | 190 | 0.8 |

As clearly shown in the above-noted Tables 9 and 10, when the added amount y of La was varied from 0.05 to 0.25 and the added amount x of MgO was varied from 0.01 to 0.10, it was confirmed that the sample had a larger $\gamma$ and smaller $\epsilon$r and tan$\delta$ compared with samples of x=0 and with the bulk value.

As described above, a ferroelectric thin film comprising the composition of this invention is an extremely excellent material which has improved $\gamma$ and reduced $\epsilon$r and tan$\delta$, when comparing these values with those of thin films having a composition outside the scope of this invention and with the bulk value of conventional PbTiO$_3$.

In this embodiment, the target used for sputtering was a MgO ceramic target. However, it was confirmed that the same results could be attained by using a metal Mg as target and by letting in sputtering gases Ar and O$_2$ in a ratio of 9:3 into the chamber. Furthermore, although the targets used for sputtering comprised three different kinds, namely, [(1-w)·PbTiO$_3$+w·PbO] or [(1-w)·(PbO+TiO$_2$)+w·PbO] (w=0.05–0.40), a La$_2$O$_3$ target, and a MgO target, it was also confirmed that the same results could be attained by combining three different kinds of target consisting of [Pb$_{1-y}$La$_y$Ti$_{1-y/4}$O$_3$] or [(1-y)·PbO+y/2·La$_2$O$_3$(1-y/4)·TiO$_2$] (y=0.05–0.25), a PbO target, and a MgO target or a Mg target, or by combining three different kinds of target consisting of [(1-x)·PbTiO$_3$+x·MgO] or [(1-x)·(PbO+TiO$_2$) +x·MgO] (x=0.01–0.10), a La$_2$O$_3$ target, and a PbO target.

EXAMPLE 6

As in Example 4, the ferroelectric thin film of this invention was manufactured by a polyphyletic high frequency magnetron sputtering method. As for targets used for sputtering, three different kinds of target were used; that is, target 16, [PbTiO$_3$+PbO] powder, target 17, a La$_2$O$_3$ ceramic, and target 18, a MnO$_2$ ceramic. Among them, target 16 of powder (PbTiO$_3$+PbO) is composed of [(1-w)·PbTiO$_3$+w·PbO] or [(1-w)·(PbO+TiO$_2$)+w·PbO] (w=0.05~0.40). Target 16 was formed with the same method as in Examples 1 to 4.

These three kinds of targets 16, 17, and 18 were positioned in chamber 24, and a thin film was formed in the same manner as in Examples 1 to 4 on the surface of a MgO single crystal substrate 25 comprising patterned platinum. As for the high frequency electric power input to each target, target 16 of pressed [PbTiO$_3$+PbO] powder was fixed at 2.1 W/cm$^2$ (13.56 MHz), and target 17 of La$_2$O$_3$ ceramics was varied optionally from 0 W to 0.7 W/cm$^2$ (13.56 MHz), and target 18 of MnO$_2$ ceramics was varied optionally from 0 W to 0.7 W/cm$^2$ (13.56 MHz). By doing so, the added amount of La$_2$O$_3$ and MnO$_2$ was controlled. In this way, a ferroelectric thin film composed of [(1-z)·Pb$_{1-y}$La$_y$Ti$_{1-y/4}$O$_3$+z·MnO$_2$] (y=0.05~0.25, z=0.02~0.05) was produced. The thin film obtained had a thickness of about 1.26 μm after five hours of deposition time. On top of this ferroelectric thin film, a Ni—Cr electrode was formed as an upper electrode by a DC sputtering method for the purpose of measurement and was patterned.

When this thin film was obtained, the solid capacity of each element was measured by an x-ray microanalyzer, and the crystal phase and c-axis orientation rate α (=I(001)/{I(001)+I(100)}) were measured by an x-ray diffracting method. As a result, the crystal phase comprised a perfect perovskite single phase in which only (001), (100), and their high-order peaks were confirmed. Based on this result, when α was calculated, the as-grown thin film was in the range of 0.86≦α≦1.00 and showed a high c-axis orientation property.

Next, pyroelectric coefficient γ, dielectric constant εr, and dielectric loss tanδ of this thin film were measured between the foundation electrode and the upper electrode. Tables 11 and 12 show pyroelectric coefficient γ, dielectric constant εr, and dielectric loss tanδ of the thin film in each composition. Table 12 also indicates a bulk value of PbTiO$_3$.

TABLE 11

The pyroelectric coefficient γ, dielectric constant εr, and dielectric loss tan σ of a ferroelectric thin film having a composition of [(1 − z) · Pb$_{1-y}$La$_y$Ti$_{1-y/4}$O$_3$ + z · MnO$_2$] (y = 0.05–0.25, z = 0–0.05)
(Three kinds of target)

| Composition (1 − z) · Pb$_{1-y}$La$_y$Ti$_{1-y/4}$O$_3$ + x · MnO$_2$ | | pyroelectric coefficient γ (C/cm$^2$K) | dielectric constant εr | dielectric loss tan σ (%) |
|---|---|---|---|---|
| Y = 0.05 | z = 0 | 4.1 × 10$^{-8}$ | 180 | 0.9 |
| Y = 0.05 | z = 0.002 | 5.2 × 10$^{-8}$ | 145 | 0.8 |
| Y = 0.05 | z = 0.005 | 6.7 × 10$^{-8}$ | 125 | 0.6 |
| Y = 0.05 | z = 0.01 | 7.5 × 10$^{-8}$ | 110 | 0.5 |
| Y = 0.05 | z = 0.02 | 6.8 × 10$^{-8}$ | 135 | 0.5 |
| Y = 0.05 | z = 0.03 | 5.6 × 10$^{-8}$ | 150 | 0.6 |
| Y = 0.05 | z = 0.05 | 5.3 × 10$^{-8}$ | 160 | 0.7 |
| Y = 0.10 | z = 0 | 5.2 × 10$^{-8}$ | 230 | 1.1 |
| Y = 0.10 | z = 0.002 | 7.0 × 10$^{-8}$ | 200 | 1.0 |
| Y = 0.10 | z = 0.005 | 7.7 × 10$^{-8}$ | 165 | 0.8 |
| Y = 0.10 | z = 0.01 | 9.5 × 10$^{-8}$ | 145 | 0.6 |
| Y = 0.10 | z = 0.02 | 8.8 × 10$^{-8}$ | 160 | 0.7 |
| Y = 0.10 | z = 0.03 | 7.9 × 10$^{-8}$ | 180 | 0.7 |
| Y = 0.10 | z = 0.05 | 7.0 × 10$^{-8}$ | 195 | 0.8 |
| Y = 0.15 | z = 0 | 6.8 × 10$^{-8}$ | 320 | 1.1 |
| Y = 0.15 | z = 0.002 | 8.8 × 10$^{-8}$ | 295 | 0.9 |
| Y = 0.15 | z = 0.005 | 9.8 × 10$^{-8}$ | 250 | 0.8 |
| Y = 0.15 | z = 0.01 | 12 × 10$^{-8}$ | 215 | 0.7 |
| Y = 0.15 | z = 0.02 | 11 × 10$^{-8}$ | 220 | 0.6 |
| Y = 0.15 | z = 0.03 | 10 × 10$^{-8}$ | 240 | 0.8 |
| Y = 0.15 | z = 0.05 | 9.2 × 10$^{-8}$ | 280 | 0.9 |

TABLE 12

The pyroelectric coefficient γ, dielectric constant εr, and dielectric loss tan σ of a ferroelectric thin film having a composition of [(1 − z) · Pb$_{1-y}$La$_y$Ti$_{1-y/4}$O$_3$ + z · MnO$_2$] (y = 0.05–0.25, z = 0–0.05)
(Three kinds of target)

| Composition (1 − z) · Pb$_{1-y}$La$_y$Ti$_{1-y/4}$O$_3$ + x · MnO$_2$ | | pyroelectric coefficient γ (C/cm$^2$K) | dielectric constant εr | dielectric loss tan σ (%) |
|---|---|---|---|---|
| Y = 0.20 | z = 0 | 9.4 × 10$^{-8}$ | 620 | 1.2 |
| Y = 0.20 | z = 0.002 | 11 × 10$^{-8}$ | 460 | 1.0 |
| Y = 0.20 | z = 0.005 | 14 × 10$^{-8}$ | 375 | 0.9 |
| Y = 0.20 | z = 0.01 | 16 × 10$^{-8}$ | 340 | 0.7 |
| Y = 0.20 | z = 0.02 | 14 × 10$^{-8}$ | 395 | 0.8 |

TABLE 12-continued

The pyroelectric coefficient γ, dielectric constant ε r, and dielectric
loss tan σ of a ferroelectric thin film having a composition of [(1 − z) ·
$Pb_{1-y}La_yTi_{1-y/4}O_3 + z \cdot MnO_2$] (y = 0.05–0.25, z = 0–0.05)
(Three kinds of target)

| Composition<br>(1 − z) · $Pb_{1-y}La_yTi_{1-y/4}O_3 + x \cdot MnO_2$ | | pyroelectric<br>coefficient γ<br>(C/cm²K) | dielectric<br>constant ε r | dielectric<br>loss tan σ (%) |
|---|---|---|---|---|
| Y = 0.20 | z = 0.03 | 12 × 10⁻⁸ | 430 | 0.9 |
| Y = 0.20 | z = 0.05 | 11 × 10⁻⁸ | 485 | 1.1 |
| Y = 0.25 | z = 0 | 6.2 × 10⁻⁸ | 1480 | 1.5 |
| Y = 0.25 | z = 0.002 | 7.2 × 10⁻⁸ | 1000 | 1.4 |
| Y = 0.25 | z = 0.005 | 10 × 10⁻⁸ | 910 | 1.2 |
| Y = 0.25 | z = 0.01 | 12 × 10⁻⁸ | 660 | 0.9 |
| Y = 0.25 | z = 0.02 | 11 × 10⁻⁸ | 780 | 0.9 |
| Y = 0.25 | z = 0.03 | 10 × 10⁻⁸ | 865 | 1.0 |
| Y = 0.25 | z = 0.05 | 9.1 × 10⁻⁸ | 950 | 1.2 |
| PbTiO₃ (bulk) | | 2.0 × 10⁻⁸ | 190 | 0.8 |

As clearly shown in the above-noted Tables 11 and 12, when the added amount y of La was varied from 0.05 to 0.25 and the added amount z of $MnO_2$ was varied from 0.002 to 0.05, it was confirmed that the sample had a larger γ and smaller εr and tanδ compared with samples of z=0 and with the bulk value.

As described above, a ferroelectric thin film comprising the composition of this invention is a remarkably excellent material which has improved γ and reduced εr and tanδ, when comparing these values with those of thin films having a composition beyond the limits of this invention, and also comparing with the bulk value of conventional $PbTiO_3$.

In this embodiment, the target used for sputtering was a $MnO_2$ ceramic target. However, it was confirmed that the same results could be attained by using a metal Mn as a target and by letting in sputtering gases Ar and $O_2$ in a ratio of 9:3 into the chamber. Furthermore, although the targets used for sputtering comprised three different kinds, namely, a target [(1-w)·$PbTiO_3$+w·PbO] or [(1-w)·(PbO+$TiO_2$)+w·PbO] (w=0.05–0.40), a $La_2O_3$ target, and a $MnO_2$ target, it was also confirmed that the same results could be attained by combining three different kinds of target consisting of [$Pb_{1-y}La_yTi_{1-y/4}O_3$] or [(1-y)·PbO+y/2·$La_2O_3$+(1-y/4)·$TiO_2$] (y=0.05–0.25), a PbO target, and a $MnO_2$ target or a Mn target, or by combining three different kinds of target consisting of [(1-z)·$PbTiO_3$+z·$MnO_2$] or [(1-z)·(PbO+$TiO_2$)+z·$MnO_2$] (z=0.002–0.05), a $La_2O_3$ target, and a PbO target.

EXAMPLE 7

As in Example 3, the ferroelectric thin film of this invention was manufactured by a polyphyletic high frequency magnetron sputtering method. As for targets used for sputtering, four different kinds of target were used; that is, target 16, $PbTiO_3$ powder, target 17, a $La_2O_3$ ceramic, target 18, a MgO ceramic, and target 19, a PbO ceramic. Among them, target 16 of $PbTiO_3$ powder is composed of [$PbTiO_3$] or [PbO+$TiO_2$]. Target 16 was formed with the same method as in Examples 1 to 6.

These four kinds of targets 16, 17, 18, and 19 were positioned in chamber 24, and a thin film was formed in the same manner as in Examples 1 to 4 on the surface of a MgO single crystal substrate 25 comprising patterned platinum. As for the high frequency electric power input to each target, target 16 of pressed $PbTiO_3$ powder was fixed at 2.1 W/cm² (13.56 MHz), and target 17 of $La_2O_3$ ceramics was varied optionally from 0 W to 0.7 W/cm² (13.56 MHz),and target 18 of MgO ceramics was varied optionally from 0 W to 1.2 W/cm² (13.56 MHz), and target 19 of PbO ceramics was varied optionally from 0 W to 0.5 W/cm² (13.56 MHz). By doing so, the added amount of $La_2O_3$ and $MnO_2$ was controlled, and any lacking PbO was supplemented. In this way, a ferroelectric thin film composed of [(1-x)·$Pb_{1-y}La_yTi_{1-y/4}O_3$+x·MgO] (x=0.01–0.10, y=0.05–0.25) was produced. The thin film obtained had a thickness of about 1.4 μm after five hours of formation time. On top of this ferroelectric thin film, a Ni—Cr electrode was formed as an upper electrode by a DC sputtering method for the purpose of measurement and was patterned.

When this thin film was obtained, the solid capacity of each element was measured by an x-ray microanalyzer, and the crystal phase and c-axis orientation rate α (=I(001)/{I(001)+I(100)}) were measured by an x-ray diffracting method. As a result, the crystal phase comprised a perfect perovskite single phase in which only (001), (100), and their high-order peaks were confirmed. Based on this, when a was calculated, the as-grown thin film was in the range of 0.83≤α≤1.00 and showed a high c-axis orientation property.

Next, pyroelectric coefficient γ, dielectric constant εr, and dielectric loss tanδ of this thin film were measured between the foundation electrode and the upper electrode. Tables 13 and 14 show pyroelectric coefficient γ, dielectric constant εr, and dielectric loss tanδ of the thin film in each composition. Table 14 also indicates the bulk value of $PbTiO_3$.

TABLE 13

The pyroelectric coefficient γ, dielectric constant ε r, and dielectric loss tan σ of a ferroelectric thin film having a composition of [(1 − x) · $Pb_{1-y}La_yTi_{1-y/4}O_3$ + x · MgO] (x = 0–0.10, y = 0.05–0.25) (Four kinds of target)

| Composition (1 − z) · $Pb_{1-y}La_yTi_{1-y/4}O_3$ + x · MgO | | pyroelectric coefficient γ (C/cm²K) | dielectric constant ε r | dielectric loss tan σ (%) |
|---|---|---|---|---|
| X = 0 | Y = 0.05 | 4.1 × 10⁻⁸ | 170 | 1.0 |
| X = 0.01 | Y = 0.05 | 4.6 × 10⁻⁸ | 140 | 0.9 |
| X = 0.02 | Y = 0.05 | 6.0 × 10⁻⁸ | 130 | 0.7 |
| X = 0.04 | Y = 0.05 | 7.3 × 10⁻⁸ | 115 | 0.6 |
| X = 0.06 | Y = 0.05 | 7.8 × 10⁻⁸ | 110 | 0.5 |
| X = 0.08 | Y = 0.05 | 7.2 × 10⁻⁸ | 120 | 0.6 |
| X = 0.10 | Y = 0.05 | 6.9 × 10⁻⁸ | 135 | 0.7 |
| X = 0 | Y = 0.10 | 5.2 × 10⁻⁸ | 235 | 1.2 |
| X = 0.01 | Y = 0.10 | 6.0 × 10⁻⁸ | 215 | 1.0 |
| X = 0.02 | Y = 0.10 | 7.5 × 10⁻⁸ | 190 | 0.8 |
| X = 0.04 | Y = 0.10 | 9.0 × 10⁻⁸ | 175 | 0.7 |
| X = 0.06 | Y = 0.10 | 9.5 × 10⁻⁸ | 150 | 0.7 |
| X = 0.08 | Y = 0.10 | 9.0 × 10⁻⁸ | 145 | 0.7 |
| X = 0.10 | Y = 0.10 | 8.5 × 10⁻⁸ | 160 | 0.8 |
| X = 0 | Y = 0.15 | 6.8 × 10⁻⁸ | 315 | 1.3 |
| X = 0.01 | Y = 0.15 | 7.8 × 10⁻⁸ | 290 | 1.1 |
| X = 0.02 | Y = 0.15 | 8.9 × 10⁻⁸ | 275 | 0.9 |
| X = 0.04 | Y = 0.15 | 9.8 × 10⁻⁸ | 245 | 0.8 |
| X = 0.06 | Y = 0.15 | 10 × 10⁻⁸ | 220 | 0.8 |
| X = 0.08 | Y = 0.15 | 11 × 10⁻⁸ | 195 | 0.8 |
| X = 0.10 | Y = 0.15 | 10 × 10⁻⁸ | 210 | 0.9 |

TABLE 14

The pyroelectric coefficient γ, dielectric constant ε r, and dielectric loss tan δ of a ferroelectic thin film having a composition of [(1 − x) · $Pb_{1-y}La_yTi_{1-y/4}O_3$ + x · MgO] (x = 0–0.10, y = 0.05–0.25) (Four kinds of target)

| Composition (1 − x) · $Pb_{1-y}La_yTi_{1-y/4}O_3$ + x · MgO | | pyroelectric coefficient γ (C/cm²K) | dielectric constant ε r | dielectric loss tan δ (%) |
|---|---|---|---|---|
| X = 0 | Y = 0.20 | 8.8 × 10⁻⁸ | 620 | 1.5 |
| X = 0.01 | Y = 0.20 | 9.5 × 10⁻⁸ | 545 | 1.2 |
| X = 0.02 | Y = 0.20 | 13 × 10⁻⁸ | 465 | 1.0 |
| X = 0.04 | Y = 0.20 | 16 × 10⁻⁸ | 405 | 0.9 |
| X = 0.06 | Y = 0.20 | 16 × 10⁻⁸ | 370 | 0.8 |
| X = 0.08 | Y = 0.20 | 15 × 10⁻⁸ | 360 | 0.7 |
| X = 0.10 | Y = 0.20 | 13 × 10⁻⁸ | 450 | 0.8 |
| X = 0 | Y = 0.25 | 5.8 × 10⁻⁸ | 1520 | 1.8 |
| X = 0.01 | Y = 0.25 | 7.3 × 10⁻⁸ | 1100 | 1.5 |
| X = 0.02 | Y = 0.25 | 8.7 × 10⁻⁸ | 915 | 1.3 |
| X = 0.04 | Y = 0.25 | 10 × 10⁻⁸ | 730 | 1.1 |
| X = 0.06 | Y = 0.25 | 11 × 10⁻⁸ | 620 | 0.9 |
| X = 0.08 | Y = 0.25 | 10 × 10⁻⁸ | 670 | 0.8 |
| X = 0.10 | Y = 0.25 | 9.5 × 10⁻⁸ | 850 | 1.0 |
| PbTiO₃ (bulk) | | 2.0 × 10⁻⁸ | 190 | 0.8 |

As clearly shown in the above-noted Tables 13 and 14, when the added amount y of La was varied from 0.05 to 0.25 and the added amount x of MgO was varied from 0.01 to 0.10, it was confirmed that the sample had a larger γ and smaller εr and tanδ compared with samples of x=o and with the bulk value.

As described above, a ferroelectric thin film comprising the composition of this invention is an extremely excellent material which has improved γ and reduced εr and tanδ, when comparing these values with those of thin films having a composition outside the scope of this invention, and comparing with the bulk value of conventional PbTiO₃.

In this embodiment, the target used for sputtering was a MgO ceramic target. However, it was confirmed that the same results could be attained by using a metal Mg as target and by letting in sputtering gases Ar and O₂ in a ratio of 9:3 into the chamber.

EXAMPLE 8

As in Example 4, the ferroelectric thin film of this invention was manufactured by a polyphyletic high frequency magnetron sputtering method. As for targets used for sputtering, four different kinds of target were used; that is, target 16, PbTiO₃ powder, target 17, a La₂O₃ ceramic, target 18, a MnO₂ ceramic, and target 19, a PbO ceramic. Among them, target 16 of PbTiO₃ powder is composed of [PbTiO₃] or [PbO+TiO₂]. Target 16 was formed with the same method as in Examples 1 to 6.

These four kinds of targets 16, 17, 18, and 19 were positioned in chamber 24, and a thin film was formed in the same manner as in Examples 1 to 4 on the surface of a MgO single crystal substrate 25 comprising patterned platinum. As for the high frequency electric power input to each target, target 16 of pressed $PbTiO_3$ powder was fixed at 2.1 $W/cm^2$ (13.56 MHz), and target 17 of $La_2O_3$ ceramics was varied optionally from 0 W to 0.7 $W/cm^2$ (13.56 MHz), and target 18 of $MnO_2$ ceramics was varied optionally from 0 W to 0.7 $W/cm^2$ (13.56 MHz), and target 19 of PbO ceramics was varied optionally from 0 W to 0.5 $W/cm^2$ (13.56 MHz). By doing so, the added amount of $La_2O_3$ and of $MnO_2$ was controlled, and any lacking PbO was supplemented. In this way, a ferroelectric thin film composed of $[(1-z) \cdot Pb_{1-y}La_yTi_{1-y/4}O_3+z \cdot MnO_2]$ (y=0.05~0.25, z=0.002~0.05) was produced. The thin film obtained had a thickness of about 1.38 μm after five hours of deposition time. On top of this ferroelectric thin film, a Ni—Cr electrode was formed as an upper electrode by a DC sputtering method for the purpose of measurement and was patterned.

When this thin film was obtained, the solid capacity of each element was measured by an x-ray microanalyzer, and the crystal phase and c-axis orientation rate α $(=I(001)/\{I(001)+I(100)\})$ were measured by an x-ray diffracting method. As a result, the crystal phase comprised a perfect perovskite single phase in which only (001), (100), and their high-order peaks were confirmed. Based on this result, when α was calculated, an as-grown thin film was in the range of $0.84 \leq \alpha \leq 1.00$ and showed a high c-axis orientation property.

Next, pyroelectric coefficient γ, dielectric constant εr, and dielectric loss tanδ of this thin film were measured between the foundation electrode and the upper electrode. Tables 15 and 16 show pyroelectric coefficient γ, dielectric constant εr, and dielectric loss tanδ of the thin film in each composition. Table 16 also indicates the bulk value of $PbTiO_3$.

TABLE 15

The pyroelectric coefficient γ, dielectric constant ε r, and dielectric loss tan δ of a ferroelectic thin film having a composition of $[(1 - z) \cdot Pb_{1-y}La_yTi_{1-y/4}O_3 + z \cdot MnO_2]$ (y = 0.05–0.25, z = 0–0.05)
(Four kinds of target)

| Composition $(1 - x) \cdot Pb_{1-y}La_yTi_{1-y/4}O_3 + x \cdot MgO$ | | pyroelectric coefficient γ $(C/cm^2K)$ | dielectric constant ε r | dielectric loss tan δ (%) |
|---|---|---|---|---|
| Y = 0.05 | z = 0 | $4.1 \times 10^{-8}$ | 180 | 0.9 |
| Y = 0.05 | z = 0.002 | $5.0 \times 10^{-8}$ | 125 | 0.8 |
| Y = 0.05 | z = 0.005 | $6.5 \times 10^{-8}$ | 120 | 0.6 |
| Y = 0.05 | z = 0.01 | $7.2 \times 10^{-8}$ | 110 | 0.6 |
| Y = 0.05 | z = 0.02 | $7.0 \times 10^{-8}$ | 130 | 0.7 |
| Y = 0.05 | z = 0.03 | $5.9 \times 10^{-8}$ | 145 | 0.8 |
| Y = 0.05 | z = 0.05 | $5.2 \times 10^{-8}$ | 160 | 0.9 |
| Y = 0.10 | z = 0 | $5.3 \times 10^{-8}$ | 210 | 1.2 |
| Y = 0.10 | z = 0.002 | $7.0 \times 10^{-8}$ | 180 | 1.0 |
| Y = 0.10 | z = 0.005 | $8.0 \times 10^{-8}$ | 155 | 0.9 |
| Y = 0.10 | z = 0.01 | $9.2 \times 10^{-8}$ | 135 | 0.7 |
| Y = 0.10 | z = 0.02 | $8.5 \times 10^{-8}$ | 150 | 0.7 |
| Y = 0.10 | z = 0.03 | $7.8 \times 10^{-8}$ | 170 | 0.8 |
| Y = 0.10 | z = 0.05 | $7.0 \times 10^{-8}$ | 180 | 1.0 |

TABLE 16

The pyroelectric coefficient γ, dielectric constant ε r, and dielectric loss tan σ of a ferroelectric thin film having a composition of $[(1 - z) \cdot Pb_{1-y}La_yTi_{1-y/4}O_3 + z \cdot MnO_2]$ (y = 0.05–0.25, z = 0–0.05)
(Four kinds of target)

| Composition $(1 - z) \cdot Pb_{1-y}La_yTi_{1-y/4}O_3 + x \cdot MgO$ | | pyroelectric coefficient γ $(C/cm^2K)$ | dielectric constant ε r | dielectric loss tan σ (%) |
|---|---|---|---|---|
| Y = 0.15 | z = 0 | $6.8 \times 10^{-8}$ | 310 | 1.4 |
| Y = 0.15 | z = 0.002 | $8.8 \times 10^{-8}$ | 285 | 1.1 |
| Y = 0.15 | z = 0.005 | $9.9 \times 10^{-8}$ | 230 | 0.9 |
| Y = 0.15 | z = 0.01 | $11 \times 10^{-8}$ | 215 | 0.7 |
| Y = 0.15 | z = 0.02 | $10 \times 10^{-8}$ | 230 | 0.7 |
| Y = 0.15 | z = 0.03 | $9.1 \times 10^{-8}$ | 255 | 0.8 |
| Y = 0.15 | z = 0.05 | $8.5 \times 10^{-8}$ | 290 | 0.9 |
| Y = 0.20 | z = 0 | $9.4 \times 10^{-8}$ | 600 | 1.5 |
| Y = 0.20 | z = 0.002 | $11 \times 10^{-8}$ | 480 | 1.3 |
| Y = 0.20 | z = 0.005 | $14 \times 10^{-8}$ | 390 | 1.1 |
| Y = 0.20 | z = 0.01 | $16 \times 10^{-8}$ | 355 | 0.9 |
| Y = 0.20 | z = 0.02 | $13 \times 10^{-8}$ | 410 | 0.7 |
| Y = 0.20 | z = 0.03 | $11 \times 10^{-8}$ | 450 | 0.8 |
| Y = 0.20 | z = 0.05 | $10 \times 10^{-8}$ | 510 | 0.9 |
| Y = 0.25 | z = 0 | $6.2 \times 10^{-8}$ | 1550 | 1.7 |
| Y = 0.25 | z = 0.002 | $7.5 \times 10^{-8}$ | 1120 | 1.3 |
| Y = 0.25 | z = 0.005 | $9.2 \times 10^{-8}$ | 950 | 1.1 |
| Y = 0.25 | z = 0.01 | $11 \times 10^{-8}$ | 710 | 0.9 |

TABLE 16-continued

The pyroelectric coefficient γ, dielectric constant ε r, and dielectric loss tan σ of a ferroelectric thin film having a composition of [(1 − z) · $Pb_{1-y}La_yTi_{1-y/4}O_3 + z \cdot MnO_2$] (y = 0.05~0.25, z = 0~0.05)
(Four kinds of target)

| Composition<br>(1 − z) · $Pb_{1-y}La_yTi_{1-y/4}O_3$ + x · MgO | | pyroelectric<br>coefficient γ<br>(C/cm²K) | dielectric<br>constant ε r | dielectric<br>loss tan σ (%) |
|---|---|---|---|---|
| Y = 0.25 | z = 0.02 | 10 × 10⁻⁸ | 735 | 0.8 |
| Y = 0.25 | z = 0.03 | 9.6 × 10⁻⁸ | 910 | 0.9 |
| Y = 0.25 | z = 0.05 | 8.6 × 10⁻⁸ | 985 | 1.1 |
| PbTiO₃ (bulk) | | 2.0 × 10⁻⁸ | 190 | 0.8 |

As clearly shown in the above-noted Tables 15 and 16, when the added amount y of La was varied from 0.05 to 0.25 and the added amount z of MnO₂ was varied from 0.002 to 0.05, it was confirmed that the sample had a larger γ and smaller εr and tanδ compared with samples of z=o and with the bulk value.

As described above, a ferroelectric thin film comprising the composition of this invention is a remarkably excellent material which has improved γ and reduced εr and tanδ, when comparing these values with those of thin films comprising a composition outside the scope of this invention, and compared with the bulk value of conventional PbTiO₃.

In this embodiment, the target used for sputtering was a MnO₂ ceramic target. However, it was confirmed that the same results could be attained by using a metal Mn as target and by letting in sputter gas of Ar and O₂ in a ratio of 9:3 into the chamber.

Furthermore, targets used in Examples 1 to 8 were formed by press-molding powder. The same results could be attained by using ceramic targets having the same composition.

Accordingly, the ferroelectric thin film manufactured in the above-mentioned methods of this invention is imparted with a high c-axis orientation property while the film is formed. In addition, this thin film does not require a polarization process as with a bulk crystal. Moreover, since the obtained thin film comprises lead titanate containing La and an element which forms a six-coordinate bond with oxygen atoms and which is selected from the group consisting of Mg and Mn, Mg and/or Mn fill a porous part of the B site which was caused by an additive of La into the A site. As a result, comparing this thin film with a conventional lead titanate thin film added with La, it has excellent electric characteristics as a pyroelectric material, such as dielectric constant εr, pyroelectric coefficient γ, and dielectric loss tanδ. Moreover, when the thin film was formed in a sputtering method by using a plurality of different targets, a composition can be controlled by controlling the high frequency electric power input to each target. Thus, the invention provides a pyroelectric sensor material which can attain electronic devices of compact size, high sensitivity, and high speed response. Therefore, the ferroelectric thin film and the method of manufacturing the thin film of this invention have extremely high industrial value.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A ferroelectric thin film comprising lead titanate containing La, and at least one element which forms a six-coordinate bond with oxygen atoms and which is selected from the group consisting of Mg and Mn, said thin film having a composition of (1-x)·$Pb_{1-y}La_yTi_{1-y/4}O_3$+x·MgO, where x=0.01~0.10 and y=0.05~0.25 or (1-z)·$Pb_{1-y}La_yTi_{1-y/4}O_3$+z·MnO₂, where y=0.05~0.25 and z=0.002~0.05.

2. The ferroelectric thin film as in claim 1, wherein said thin film has a composition of (1-x)·$Pb_{1-y}La_yTi_{1-y/4}O_3$+x·MgO, where x=0.01~0.10 and y=0.05~0.25.

3. The ferroelectric thin film as in claim 1, wherein said thin film has a composition of (1-z)·$Pb_{1-y}La_yTi_{1-y/4}O_3$+z·MnO₂, where y=0.05~0.25 and z=0.002~0.05.

4. The ferroelectric thin film as in claim 1, wherein said ferroelectric thin film has a crystal phase that is a perovskite single phase.

5. The ferroelectric thin film of claim 1, wherein said ferroelectric thin film has a thickness in the range of 100 nm to 10 μm.

6. The ferroelectric thin film as in claim 1, wherein said ferroelectric thin film is a thin film which does not require a polarization process.

7. The ferroelectric thin film as in claim 1, wherein said ferroelectric thin film has an orientation rate α of 0.85≦α≦1.00 in an X-ray diffraction analysis, provided that the height at (001) peak is I(001), the height at (100) peak is I(100), and α=I(001)/{I(001)+I(100)}.

8. The ferroelectric thin film as in claim 1, wherein said ferroelectric thin film is disposed between two layers of electrode.

* * * * *